United States Patent
Zhu

(10) Patent No.: US 11,631,669 B2
(45) Date of Patent: Apr. 18, 2023

(54) PARALLEL STRUCTURE, METHOD OF MANUFACTURING THE SAME, AND ELECTRONIC DEVICE INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 236 days.

(21) Appl. No.: 17/042,832

(22) PCT Filed: Oct. 31, 2018

(86) PCT No.: PCT/CN2018/113040
§ 371 (c)(1),
(2) Date: Sep. 28, 2020

(87) PCT Pub. No.: WO2020/073377
PCT Pub. Date: Apr. 16, 2020

(65) Prior Publication Data
US 2021/0028168 A1 Jan. 28, 2021

(30) Foreign Application Priority Data

Oct. 8, 2018 (CN) .......................... 201811171611.7

(51) Int. Cl.
*H01L 27/06* (2006.01)
*H01L 27/088* (2006.01)
(Continued)

(52) U.S. Cl.
CPC ............ *H01L 27/088* (2013.01); *H01L 21/77* (2013.01); *H01L 25/0657* (2013.01); *H01L 29/66712* (2013.01); *H01L 29/7802* (2013.01)

(58) Field of Classification Search
CPC ....... H01L 25/00; H01L 25/50; H01L 25/065; H01L 25/0657; H01L 27/06;
(Continued)

(56) References Cited

U.S. PATENT DOCUMENTS

| 7,091,072 B2 | 8/2006 | Park et al. |
| 7,960,243 B2 | 6/2011 | Winstead et al. |
| 8,587,039 B2 | 11/2013 | Winstead et al. |

(Continued)

FOREIGN PATENT DOCUMENTS

| CN | 1469491 A | 1/2004 |
| CN | 1779979 A | 5/2006 |

(Continued)

*Primary Examiner* — Chuong A Luu
(74) *Attorney, Agent, or Firm* — Christensen, Fonder, Dardi & Herbert PLLC

(57) ABSTRACT

A parallel structure comprising source/drain and channel layers alternately stacked on a substrate, and gate stacks formed around peripheries of the channel layers. Each of the channel layers, the source/drain layers on upper and lower sides of the channel layer, and the gate stack formed around the channel layer, form a semiconductor device. In each semiconductor device, one of the source/drain layers is in contact with a first electrically-conductive channel disposed on an outer periphery of the active region, the other is in contact with a second electrically-conductive channel on the outer periphery of the active region, and the gate stack is in contact with a third electrically-conductive channel disposed on the outer periphery of the active region. The first electrically-conductive channel is common to the semiconductor devices, the second electrically-conductive channel is com- (Continued)

mon to the semiconductor devices, and the third electronically-conductive channel is common to the semiconductor devices.

26 Claims, 20 Drawing Sheets

(51) Int. Cl.
*H01L 21/77* (2017.01)
*H01L 25/065* (2023.01)
*H01L 29/66* (2006.01)
*H01L 29/78* (2006.01)

(58) Field of Classification Search
CPC ............... H01L 27/088; H01L 27/0688; H01L 29/06; H01L 29/66; H01L 29/78; H01L 29/417; H01L 29/0653; H01L 29/739; H01L 29/786; H01L 29/7827; H01L 29/7391; H01L 29/41741; H01L 29/66545; H01L 29/66356; H01L 29/66666; H01L 29/78642; H01L 29/66734; H01L 29/66712; H01L 29/7815; H01L 29/7802; H01L 29/0843; H01L 29/0891; H01L 29/66643; H01L 29/66636; H01L 27/2454; H01L 23/52; H01L 21/77; H01L 21/822; H01L 21/8221; H01L 21/8234; H01L 21/8238; H01L 21/823418; H01L 21/823487; H01L 21/823425; H01L 21/823814; H01L 21/823807; H01L 21/823885; H01L 21/823864

USPC .......................................................... 257/329
See application file for complete search history.

(56) References Cited

U.S. PATENT DOCUMENTS

| | | |
|---|---|---|
| 9,589,956 B1 | 3/2017 | Doris et al. |
| 10,115,641 B2 | 10/2018 | Zhu |
| 10,629,498 B2 | 4/2020 | Zhu et al. |
| 10,643,905 B2 | 5/2020 | Zhu et al. |
| 10,714,398 B2 | 7/2020 | Zhu |
| 2003/0230779 A1 | 12/2003 | Park et al. |
| 2005/0064640 A1 | 3/2005 | Park et al. |
| 2008/0299717 A1 | 12/2008 | Winstead et al. |
| 2011/0220975 A1 | 9/2011 | Winstead et al. |
| 2018/0005895 A1 | 1/2018 | Cheng et al. |
| 2018/0096896 A1 | 4/2018 | Zhu |
| 2018/0097065 A1 | 4/2018 | Zhu |
| 2018/0097106 A1 | 4/2018 | Zhu |
| 2018/0108577 A1 | 4/2018 | Zhu et al. |
| 2019/0115052 A1* | 4/2019 | Seong ...................... G11C 5/04 |
| 2019/0244962 A1* | 8/2019 | Or-Bach ........... H01L 27/10897 |
| 2019/0279980 A1 | 9/2019 | Zhu |
| 2019/0287865 A1 | 9/2019 | Zhu et al. |
| 2020/0027879 A1 | 1/2020 | Zhu |
| 2020/0027950 A1 | 1/2020 | Zhu et al. |
| 2020/0135666 A1* | 4/2020 | Mergens ................ H01L 23/60 |
| 2020/0280700 A1 | 9/2020 | Zhu |

FOREIGN PATENT DOCUMENTS

| | | |
|---|---|---|
| CN | 101681821 A | 3/2010 |
| CN | 106252352 A | 12/2016 |
| CN | 107887386 A | 4/2018 |
| CN | 107887444 A | 4/2018 |

* cited by examiner

PARALLEL STRUCTURE, METHOD OF MANUFACTURING THE SAME, AND ELECTRONIC DEVICE INCLUDING THE SAME

CROSS-REFERENCE TO RELATED APPLICATION(S)

The present application claims priority to Chinese Patent Application No. 201811171611.7, filed on Oct. 8, 2018, and entitled "PARALLEL STRUCTURE, METHOD OF MANUFACTURING THE SAME, AND ELECTRONIC DEVICE INCLUDING THE SAME," which is incorporated herein by reference in its entirety.

TECHNICAL FIELD

The present disclosure generally relates to the field of semiconductors, and more particularly, to a compact parallel structure of semiconductor devices, a method of manufacturing the same, and an electronic device including the same.

BACKGROUND

Vertical devices have good device characteristics, for example, good electrostatic characteristics, good short channel effect control, small sub-threshold swing, and resultant low power consumption, which enable the devices to be further scaled down so as to increase the integration intensity. In some applications, several transistors need to be connected in parallel, for example, with the purpose of acquiring a larger driving current in order to drive other devices. Those transistors can be stacked vertically to save area. However, there is difficulty in forming interconnection among the transistors.

SUMMARY

In view of the above, the present disclosure aims to provide, among others, a compact parallel structure of semiconductor devices, a method of manufacturing the same, and an electronic device including the same.

According to an aspect of the present disclosure, there is provided a parallel structure of a semiconductor devices, comprising: a vertical active region disposed on a substrate, comprising a plurality of source/drain layers disposed sequentially in a vertical direction on the substrate and two or more channel layers respectively disposed between respective pairs of adjacent ones of the source/drain layers; gate stacks respectively formed around at least part of outer peripheries of the respective channel layers. Each of the channel layers, the source/drain layers on upper and lower sides of the channel layer, and the gate stack formed around the channel layer form a corresponding one of the semiconductor devices. In each of the semiconductor devices, one of the source/drain layers on the upper and lower sides of the corresponding channel layer is in contact with a first electrically conductive channel disposed on an outer periphery of the active region, the other one is in contact with a second electrically conductive channel disposed on the outer periphery of the active region, and the gate stack formed around the channel layer is in contact with a third electrically conductive channel disposed on the outer periphery of the active region. The first electrically conductive channel is common to the semiconductor devices, the second electrically conductive channel is common to the semiconductor devices, and the third electronically conductive channel is common to the semiconductor devices.

According to another aspect of the present disclosure, there is provided a method of manufacturing a parallel structure of semiconductor devices, comprising: disposing a semiconductor stack on a substrate, wherein the semiconductor stack includes a plurality of source/drain layers disposed sequentially in a vertical direction and two or more channel layers respectively disposed between respective pairs of adjacent ones of the source/drain layers; patterning the semiconductor stack into a predetermined shape to define an active region; forming gate stacks around at least part of outer peripheries of the respective channel layers; forming an isolation layer on outer peripheries of the active region and the gate stack; and forming a first electrically conductive channel, a second electrically conductive channel and a third electrically conductive channel on a sidewall of the isolation layer, wherein the method further comprises determining the pre-determined shape and a shape of the formed gate stacks, such that in each of the semiconductor devices, one of the source/drain layers on upper and lower sides of the corresponding channel layer passes through the isolation layer to contact the first electrically conductive channel, while the other one passes through the isolation layer to contact the second electrically conductive channel, and the corresponding gate stack passes through the isolation layer to contact the third electrically conductive channel.

According to another aspect of the present disclosure, there is provided an electronic device comprising the above parallel structure.

According to embodiments of the present disclosure, the semiconductor devices are vertically stacked in order to save area. The electrically conductive channels may be formed around the outer periphery of the active region. Therefore, layers needed to be electrically connected to each other may extend to contact a corresponding one of the electrically conductive channels, thus facilitating serial connection. Additionally, a contact to the electrically conductive channel may be disposed on top of the active region, thereby reducing or even eliminating an offset of the contact in a lateral direction, and thus reducing an overall footprint of the device.

BRIEF DESCRIPTION OF THE DRAWINGS

The above and other objects, features, and advantages of the present disclosure will become more apparent from the following description of embodiments of the present disclosure with reference to the accompanying drawings, in which:

FIGS. 1 to 20(*b*) are schematic diagrams illustrating a flow of manufacturing a semiconductor device according to an embodiment of the present disclosure, wherein, FIGS. 1 and 2 are cross-sectional views, FIG. 3(*a*) is a top view, FIGS. 3(*b*), 4, 5(*a*), 6(*a*), 7(*a*), 8(*a*), 9(*a*), 10(*a*), 11(*a*), 12(*a*), 13(*a*), 14(*a*), 15(*a*), and 16(*a*) are cross-sectional views taken along line AA' in FIG. 3(*a*), FIGS. 5(*b*), 6(*b*), 7(*b*), 8(*b*), 9(*b*), 10(*b*), 11(*b*), 12(*b*), 13(*b*), 14(*b*), 15(*b*), and 16(*b*) are cross-sectional views taken along line BB' in FIG. 3(*a*), FIG. 17(*c*) is a top view, FIG. 17(*a*) is a cross-sectional view taken along line AA' in FIG. 17(*c*), FIG. 17(*b*) is a cross-sectional view taken along line BB' in FIG. 17(*c*), FIG. 18(*c*) is a top view, FIG. 18(*a*) is a cross-sectional view taken along line AA' in FIG. 18(*c*), FIG. 18(*b*) is a cross-sectional view taken along line BB' in FIG. 18(*c*), FIG. 19(*a*) is a top view, FIG. 19(*b*) is a cross-sectional view taken along line BB' in FIG. 19(a)

Throughout the drawings, the same or like reference numerals represent the same or like elements.

DETAILED DESCRIPTION

Figure 1:
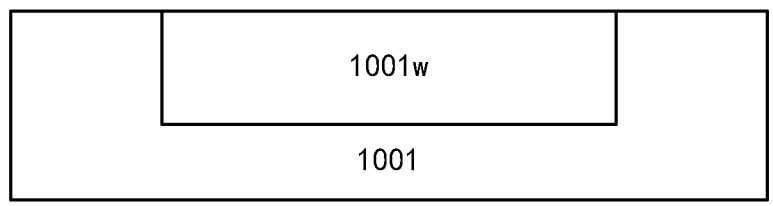

Hereinafter, embodiments of the present disclosure will be described with reference to the drawings. However, it should be understood that these descriptions are exemplary only and not intended to limit the scope of the present disclosure. In addition, in the following descriptions, descriptions of known structures and techniques might be omitted, so as not to unnecessarily obscure the concepts of the present disclosure.

Various structures according to embodiments of the present disclosure are schematically shown in the drawings. These drawings are not drawn to scale, and some details may be enlarged while some details may be omitted for the purpose of clarity. Shapes and relative sizes and positions of various regions and layers shown in the drawings are only illustrative, and there may be deviations due to manufacture tolerances or technical limitations in practice. Those skilled in the art can also devise regions/layers with different shapes, sizes, and relative positions as desired.

In the context of the present disclosure, when a layer/element is referred to as being "on" another layer/element, the layer/element may be directly on the other layer/element, or there may be an intervening layer/element interposed therebetween. In addition, if a layer/element is "on" another layer/element in an orientation, then the layer/element may be "below" the other layer/element when the orientation is turned.

A vertical semiconductor device according to embodiments of the present disclosure may comprise a plurality of vertical semiconductor devices stacked on each other on a substrate. The so called "vertical" device means that the device has its active region extending in a vertical direction (for example, in a direction substantially perpendicular to a surface of the substrate). According to embodiments of the present disclosure, the vertical active region of the semiconductor device may comprise a first source/drain layer, a channel layer and a second source/drain layer sequentially stacked. The first source/drain layer and the second source/drain layer may have source/drain regions of the device formed therein, and the channel layer may have a channel region of the device formed therein. An electrically conductive channel may be formed by the channel region between the source/drain regions on opposite ends of the channel region.

According to embodiments of the present disclosure, the semiconductor device may be a conventional field effect transistor (FET). In the case of FET, the first source/drain layer and the second source/drain layer (or, the source/drain regions on the opposite ends of the channel layer) may be doped with the same conductivity type (for example, n-type or p-type). An electrically conductive channel may be formed by the channel region between the source/drain regions on the opposite ends of the channel region. Alternatively, the semiconductor device may be a tunneling FET. In the case of the tunneling FET, the first source/drain layer and the second source/drain layer (or, the source/drain regions on the opposite ends of the channel layer) may be doped with different or opposite conductivity types (for example, respectively n-type and p-type). In such a case, charged particles such as electrons can tunnel from the source region through the channel region to the drain region, thus forming a conductive path between the source region and the drain region. Although the conventional FET and the tunneling FET have different conductive mechanisms, both of them present an electrical characteristic that whether to be conductive or not between the source/drain regions can be controlled by a gate. Therefore, for both the conventional FET and the tunneling FET, the terms "source/drain layer (source/drain region)" and "channel layer (channel region)" are used collectively in the descriptions, although there is no general "channel" in the tunneling FET.

According to embodiments of the present disclosure, in the case of the tunneling FET, the source/drain layers between the neighboring semiconductor devices may have opposite doping types, thus forming a pn junction. Such a pn junction may be short-circuited by an electrically conductive material such as metal or metal silicide formed on surfaces of the source/drain layers.

A gate stack may be formed around at least part of an outer periphery of the channel layer. According to embodiments of the present disclosure, the gate stack may be self-aligned to the channel layer. For example, the gate stack may be substantially coplanar with the channel layer. Especially, a volume occupied by the gate stack may be defined by interfaces between the channel layer and the first and second source/drain layers. In such a case, the gate stack may have an upper surface substantially coplanar with an upper surface of the channel layer, and a lower surface substantially coplanar with a lower surface of the channel layer.

The channel layer may be composed of a single crystal semiconductor material to improve device performances. Certainly, the source/drain layers may also be composed of a single crystal semiconductor material. In such a case, the single crystal semiconductor material of the channel layer and the single crystal semiconductor material of the source/drain layers may be eutectic.

According to embodiments of the present disclosure, the channel layer may have an etch selectivity with respect to the source/drain layers by, for example, including different semiconductor materials. This is advantageous to respectively processing the channel layer and the source/drain layer by, for example, selectively etching. In addition, the first source/drain layer and the second source/drain layer may have an etch selectivity with respect to each other, so as to be processed respectively.

According to embodiments of the present disclosure, a leakage limiting layer or an ON-current enhancement layer may be disposed between the first source/drain layer and the channel layer and/or between the channel layer and the second source/drain layer (in the case of the tunneling FET, especially between the two layers forming a tunneling junction). The leakage limiting layer may have a band gap greater than that of at least one of an overlying layer or an underlying layer adjacent thereto. The ON-current enhancement layer may have a band gap smaller than that of at least one of an overlying layer or an underlying layer adjacent thereto. Due to the difference in band gap, it is possible to suppress the leakage or enhance the ON-current.

In a parallel connection, the respective semiconductor devices may be electrically connected between a first electrically conductive channel and a second electrically conductive channel. More specifically, the semiconductor devices each may have one of their respective source/drains electrically connected to the first electrically conductive channel in common, and also the other of their respective source/drains electrically connected to the second electrically conductive channel in common. Additionally, the respective semiconductor devices may have their gates electrically connected to each other. Therefore, in the parallel connection, three common electrically conductive channels may be provided, that is, the first electrically conductive channel and the second electrically conductive channel to which the source/drain layers are connected, and a third electrically conductive channel to which the gate stacks (especially, gate conductor layers therein) are connected.

The first to the third electrically conductive channels may be disposed on the outer periphery of the active region. In this way, the source/drain layers and the gate stacks may form the desired electrical connection by extending laterally to corresponding ones of the electrically conductive channels. The electrically conductive channels each may have an extent in the vertical direction to cover the semiconductor devices stacked on each other, so that the source/drain layers and the gate stacks of the respective semiconductor devices can be connected to the corresponding ones of the electrically conductive channels simply by extending laterally. For the convenience of manufacture, the respective electrically conductive channels may extend in the vertical direction (for example, in a direction substantially perpendicular to the surface of the substrate). In addition, in order to avoid mutual interference with each other, the electrically conductive channels may be in different ranges in a circumferential direction of the active region. For example, the electrically conductive channels may be disposed on different sides of the active region, for example, to face each other.

For each of the semiconductor devices, the first source/drain layer thereof should be electrically connected to one of the first electrically conductive channel and the second electrically conductive channel, while the second source/drain layer thereof should be electrically connected to the other of the first electrically conductive channel and the second electrically conductive channel. In addition, according to embodiments of the present disclosure, the source/drain layer between two adjacent semiconductor devices may be shared by the two semiconductor devices. That is, for two adjacent semiconductor devices, the second source/drain layer of the lower semiconductor device and the first source/drain layer of the upper semiconductor device may be the same layer (or may be electrically connected to each other), and may be electrically connected to one of the first electrically conductive channel and the second electrically conductive channel. In addition, the first source/drain layer of the lower semiconductor device and the second source/drain layer of the upper semiconductor device may be electrically connected to the other of the first electrically conductive channel and the second electrically conductive channel. As a result, the parallel connection is achieved.

Assume that the semiconductor devices are numbered from bottom to top and that the first semiconductor device (namely, the lowermost semiconductor device) has its first source/drain layer connected to the first electrically conductive channel. Then, the first semiconductor device may have its second source/drain layer (also, the first source/drain layer of the second semiconductor device) connected to the second electrically conductive channel, the second semiconductor device may have its second source/drain layer (also, the first source/drain layer of the third semiconductor device) connected to the first electrically conductive channel, the third semiconductor device may have its second source/drain layer (also, the first source/drain layer of the fourth semiconductor device) connected to the second electrically conductive channel, and so on.

Therefore, the first source/drain layer of the first semiconductor device, the second source/drain layer of the second semiconductor device (also, the first source/drain layer of the third semiconductor device) . . . may extend laterally towards the first electrically conductive channel. The second source/drain layer of the first semiconductor device (also, the first source/drain layer of the second semiconductor device), the second source/drain layer of the third semiconductor device (also, the first source/drain layer of the fourth semiconductor device) . . . may extend laterally towards the second electrically conductive channel. The source/drain layers extending towards the same electrically conductive channel may be processed in a like way, and thus may have the same material; while the source/drain layers extending towards different electrically conductive channels need to be processed in different ways, and thus may have an etch selectivity with respect to each other.

According to embodiments of the present disclosure, at least one of a first contact to the first electrically conductive channel, a second contact to the second electrically conductive channel, or a third contact to the gate stack may be disposed on the top of the active region, and thus at least partially overlaps a main body of the active region (and also the gate stack formed around the channel layer) so as to save a footprint. For example, at least one of the first contact, the second contact, or the third contact may be located inside, at least partially, an area defined by outer peripheries of at least one layer in the active region and the gate stacks formed around the channel layers. The contacts may be connected to the respective electrically conductive channel through bridging parts. Such bridging parts may be formed by an electrically conductive layer disposed on the top surface of the active region, and different bridging parts may be substantially coplanar with each other.

According to embodiments of the present disclosure, an isolation layer may be formed on an outer sidewall of the active region and the gate stacks, in order to avoid undesirable electrical connection between the layers in the active region and the gate stacks and the electrically conductive channels. Any layer which needs not to be electrically connected to the electrically conductive channels may have its outer sidewall recessed inwards with respect to a surface of the isolation layer and thus be covered by the isolation layer, and therefore being prevented from contacting the electrically conductive channels so as not to form electrical connection therebetween. On the other hand, any layer which needs to be electrically connected to any of the electrically conductive channels may be exposed at least in a certain region by passing through the isolation layer (especially the sidewall thereof), and thus contact the electrically conductive channel to form electrical connection therebetween. For example, this may be achieved by protruding the layer with respect to the remaining layers at least in the certain region, in which case the isolation layer may expose the layer while covering the remaining layers.

Similarly, a dielectric layer may be formed on top of the active region to avoid undesirable electrical connection between the contacts formed on the top of the active region and the uppermost source/drain layer. Such a dielectric layer may be provided by, for example, a hard mask layer to be described later. For example, at least one of the first contact, the second contact, or the third contact may be formed on the dielectric layer.

Such a semiconductor device may be manufactured as follows, for example.

According to embodiments of the present disclosure, a semiconductor stack including a plurality of source/drain layers disposed sequentially in a vertical direction and two or more channel layers respectively disposed between respective pairs of adjacent ones of the source/drain layers may be disposed on a substrate. For example, this may be achieved by alternately stacking the source/drain layers and channel layers. For example, these layers may be formed by epitaxy. At least one pair of adjacent ones of the layers, which are epitaxially grown respectively, may have a clear crystal interface therebetween. In addition, the layers may be doped respectively, so that at least one pair of adjacent ones of the layers may have a doping concentration interface therebetween. In addition, as described above, the source/drain layer between the channel layers may be doped into the same type as a whole, and thus can be shared by the channel layers overlying and underlying it; or alternatively, the source/drain layer may include sub-layers, for example, two sub-layers, and at least some of the sub-layers may be doped into different types. For one same channel layer, the source/drain layers or the sub-layers overlying and underlying it may be doped into the same conductivity type (the conventional FET) or opposite conductivity types (the tunneling FET).

An active region may be defined in the above described semiconductor stack. For example, the respective layers of the stack may be selectively etched into desired shapes in sequence. Generally, the active region may be in a columnar shape, and the respective layers may be relatively recessed or protruded so as to form desired electrical contact with subsequently formed electrically conductive channels, as described above. Then, gate stacks may be formed around at least part of outer peripheries of the respective channel layers.

An isolation layer may be formed on outer peripheries of the stack and the gate stacks, so as to encapsulate sidewalls for which electrical connection is unnecessary and to expose sidewalls for which electrical connection is desired. Then, electrically conductive channels contacting the sidewalls exposed at the isolation layer may be formed on a sidewall of the isolation layer, and contacts contacting the electrically conductive channels may be formed on the top of the stack.

Since the respective layers in the stack and the gate stacks may need to be relatively recessed or protruded, a hard mask layer may be provided on top of the stack in order to facilitate patterning. The hard mask layer may define a main body of the active region. A specific one of the layers may be relatively recessed by being selectively etched (and thus the remaining layers are relatively protruded with respect to this layer). In the subsequent process, with an outer peripheral sidewall of the hard mask layer as a reference, those layers that do not need to be relatively protruded may have their respective outer peripheral sidewalls recessed inwards with respect to the outer peripheral sidewall of the hard mask layer, while those layers that need to be relatively protruded may have their respective outer peripheral sidewalls be substantially coplanar with the outer peripheral sidewall of the hard mask. In forming the isolation layer, the hard mask layer may also be used as a mask. In this way, the outer peripheral sidewall of the isolation layer may also be substantially coplanar with the outer peripheral sidewall of the hard mask layer, and thus expose the outer peripheral sidewalls of the relatively protruding layers.

For example, the hard mask layer may be used as a mask to pattern the stack. Then, the channel layers may be selectively etched, such that outer peripheries thereof may be recessed inwards with respect to the outer periphery of the hard mask layer. Sacrificial gates may be formed in recesses of the respective channel layers with respect to the outer periphery of the hard mask layer. In a first range in the circumferential direction of the active region in which a first electrically conductive channel is to be formed, the source/drain layers to be connected to the first electrically conductive channel may be relatively protruded (and also may be relatively recessed in the remaining range in the circumferential direction of the active region to avoid unnecessary electrical connection). To do this, for example, a first shielding layer may be formed in the first range to shield the sidewalls of those source/drain layers in the first range. With presence of the first shielding layer, those source/drain layers may be etched selectively, such that the outer peripheries thereof may be recessed inwards with respect to the outer periphery of the hard mask layer. In such a recess, a first partial isolation layer may be formed therein. Similarly, in a second range in the circumferential direction of the active region in which a second electrically conductive channel is to be formed, the source/drain layers to be connected to the second electrically conductive channel may be relatively protruded (and also may be relatively recessed in the remaining range in the circumferential direction of the active region to avoid unnecessary electrical connection). To do this, for example, a second shielding layer may be formed in the second range to shield the sidewalls of those source/drain layers in the second range. With presence of the second shielding layer, those source/drain layers may be etched selectively, such that the outer peripheries thereof may be recessed inwards with respect to the outer periphery of the hard mask layer. In such a recess, a second partial isolation layer may be formed therein. Then, a replacement gate process may be performed to replace the sacrificial gate with gate stacks. Similarly, in a third range in the circumferential direction of the active region in which a third electrically conductive channel is to be formed, the gate stacks to be connected to the third electrically conductive channel may be relatively protruded (and also may be relatively recessed in the remaining range in the circumferential direction of the active region to avoid unnecessary electrical connection). To do this, for example, a third shielding layer may be formed in the third range to shield the sidewalls of those gate stacks in the third range. With presence of the third shielding layer, those gate stacks may be etched selectively, such that the outer peripheries thereof may be recessed inwards with respect to the outer periphery of the hard mask layer. In such a recess, a third partial isolation layer may be formed therein. In this way, the isolation layer (the first partial isolation layer+the second partial isolation layer+the third partial isolation layer) encapsulates the stack and the gate stacks, while exposing the sidewalls of the source/drain layers to be connected to the first electrically conductive channel at the first range, the sidewalls of the source/drain layers to be connected to the second electrically conductive channel at the second range, and the sidewalls of the gate stacks to be connected to the third electrically conductive channel at the third range. The first range to the third range each may include several discrete sub-ranges, whose sizes may be different.

The present disclosure may be implemented in various forms, some examples of which will be described below.

FIGS. 1 to 20(*b*) are schematic diagrams illustrating a flow of manufacturing a semiconductor device according to an embodiment of the present disclosure.

As shown in FIG. 1, a substrate 1001 is provided. The substrate 1001 may be a substrate in various forms, including but not limited to a bulk semiconductor material substrate such as a bulk Si substrate, a semiconductor-on-insulator (SOI) substrate, a compound semiconductor substrate such as a SiGe substrate, or the like. In the following description, a bulk Si substrate is described by way of example for convenience.

A well region 1001w may be formed in the substrate 1001. If a p-type device is to be formed, the well region 1001w may be an n-type well; or alternatively, if an n-type device is to be formed, the well region 1001w may be a p-type well. The well region 1001w may be formed by, for example, injecting a corresponding conductivity type of dopants (p-type dopants such as B or In, or n-type dopants such as As or P) into the substrate 1001 followed by thermal annealing, with a doping concentration of about 1E17-2E19 cm$^3$. There are various ways in the art to provide such a well region, and thus detailed descriptions thereof are omitted here.

Figure 2:
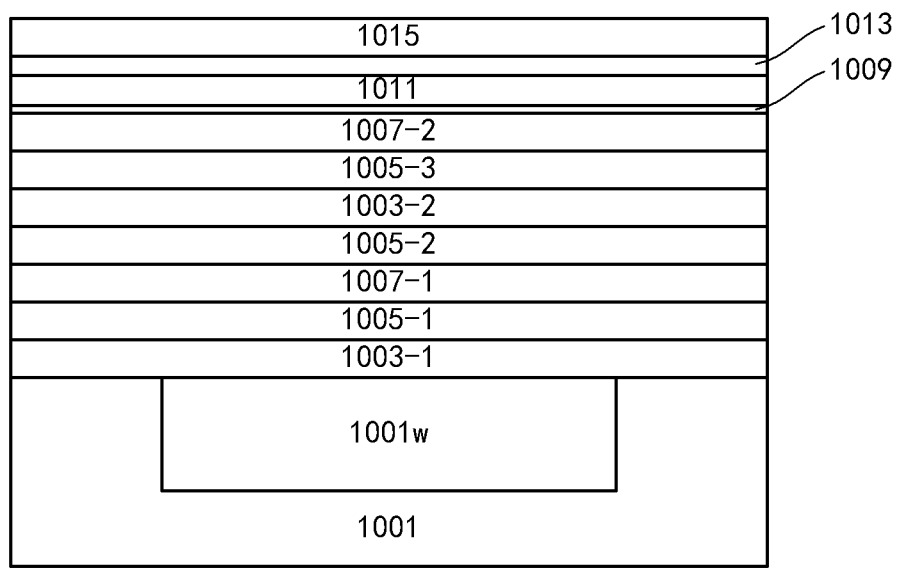

As shown in FIG. 2, on the substrate 1001, a stack of alternating source/drain layers 1003-1, 1007-1, 1003-2, 1007-2 and channel layers 1005-1, 1005-2, 1005-3 may be formed by, for example, epitaxy. These are all layers of semiconductor materials. As described above, the channel layers may have an etch selectivity with respect to the source/drain layers, and the source/drain layers overlying and underlying one same channel layer may have an etch selectivity with respect to each other. For example, the channel layers 1005-1, 1005-2, 1005-3 may comprise the same material such as SiGe (with an atomic percentage of Ge of about 10-40%), and have a thickness of about 10-100 nm. The source/drain layers 1003-1 and 1003-2 may comprise the same material such as SiGe (with an atomic percentage of Ge of about 10-40% and different from, for example less than, the atomic percentage of Ge in the channel layers, so as to provide the etch selectivity), and have a thickness of about 10-50 nm. The source/drain layers 1007-1 and 1007-2 may comprise the same materials such as Si, and have a thickness of about 10-50 nm.

In growing the source/drain layers and the channel layers, they may be doped in-situ to the desired conductivity type and doping concentration. For example, in the case of forming an n-type FET, n-type impurities such as As or P may be used to dope the source/drain layers 1003-1, 1007-1, 1003-2, 1007-2 to the n-type, at a doping concentration of about 1E18-1E21 cm$^3$; in the case of forming a p-type FET, p-type impurities such as B or In may be used to dope the source/drain layers 1003-1, 1007-1, 1003-2, 1007-2 to the p-type, at a doping concentration of about 1E18-2E20 cm$^3$. The channel layers 1005-1, 1005-2, 1005-3 may be not intentionally doped, or be lightly doped to adjust a threshold voltage ($V_t$) of the device. In addition, the difference in the doping concentration may provide the etch selectivity. In the case of forming a tunneling FET, the source/drain layers overlying and underlying one same channel layer may be doped to opposite conductivity types. Certainly, the way of doping is not limited to in-situ doping, and may be performed in other ways such as ion implantation or the like.

In this example, there are three channel layers 1005-1, 1005-2, 1005-3, which will result in three semiconductor devices stacked on each other accordingly. However, the present disclosure is not limited thereto, and more (for example, four or more) or less (for example, one or two) semiconductor devices may be formed.

A hard mask layer may be formed on the stack. The hard mask layer may comprise a stack of, for example, an etching stop layer 1009, a first mask sub-layer 1011 and a second mask sub-layer 1015. Here, for the convenience of forming electrically conductive channels later, an electrically conductive material layer 1013 may be interposed between the first mask sub-layer 1011 and the second mask sub-layer 1015. Here, the first mask sub-layer 1011 (and the etching stop layer 1009) each comprise a dielectric material, such as a low k dielectric material, and can be used thereafter for electrical isolation between overlying interconnect components, such as contacts and the electrically conductive channels, and the underlying device. For example, the etching stop layer 1009 may comprise oxide (for example, silicon oxide), with a thickness of about 2-5 nm, and may be formed by deposition or thermal oxidation; the first mask sub-layer 1011 may comprise nitride (for example, silicon nitride) or a low k dielectric material (for example, silicon carbide based materials), with a thickness of about 10-100 nm, and may be formed by deposition; the electrically conductive material layer 1013 may comprise an electrically conductive material such as metal silicide (for example, silicide containing Co, Ni, or Ti), with a thickness of about 5-20 nm, and may be formed by silicidation; and the second mask sub-layer 1015 may comprise nitride, with a thickness of about 10-100 nm, and may be formed by deposition.

Next, an active region of the device may be defined. For example, this may be achieved as follows.

Figure 3A:
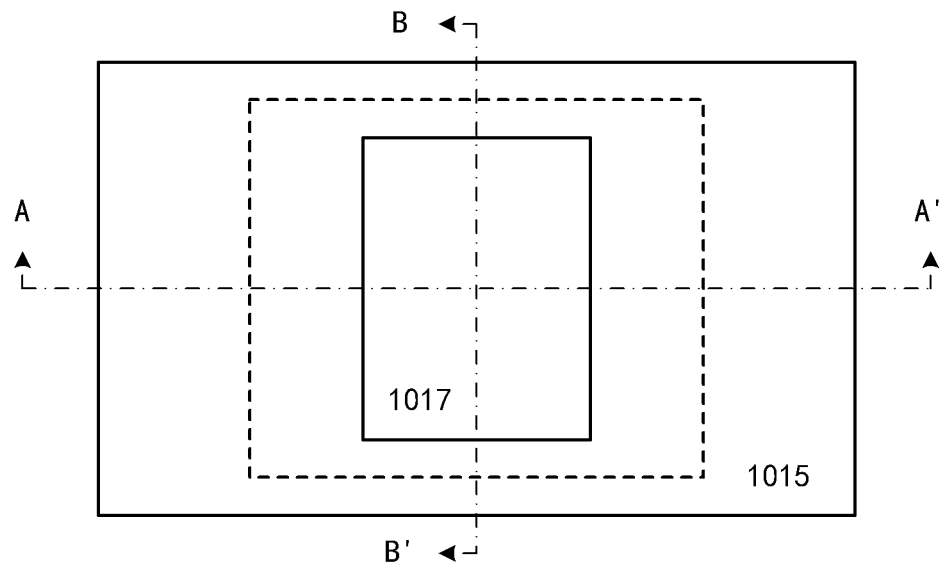
Figure 3B:
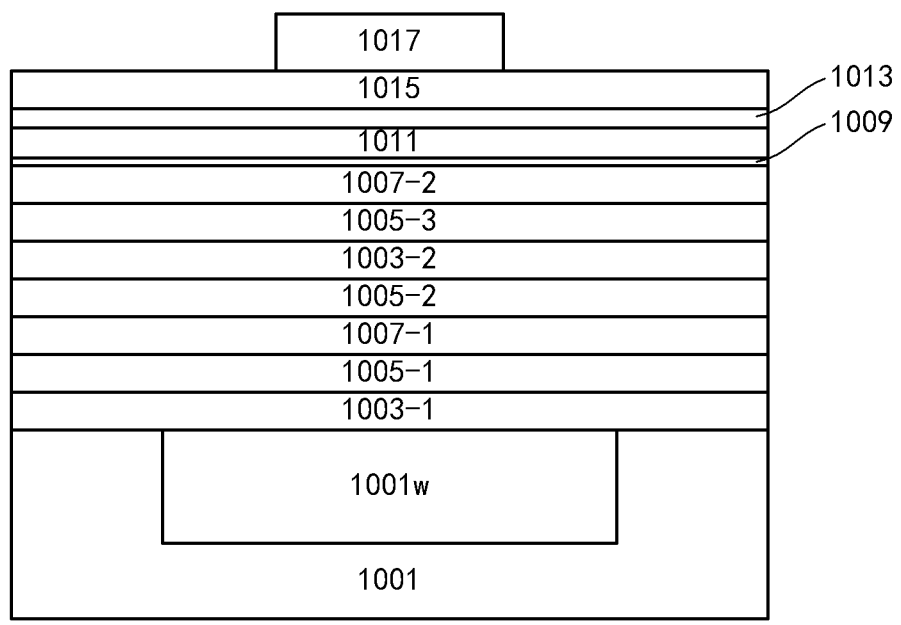

As shown in FIGS. 3(a) and 3(b), photoresist 1017 may be formed on the hard mask layer. The photoresist 1017 may be patterned into a desired shape (in this example, substantially a rectangle) by photolithography (exposure and development). As shown in the top view of FIG. 3(a), the pattern defined by the photoresist 1017 is within the range of the well region 1001w. Certainly, the pattern of the photoresist 1017 is not limited to the rectangle, and may be various other suitable shapes, such as round, oval, square, or the like.

Figure 4:
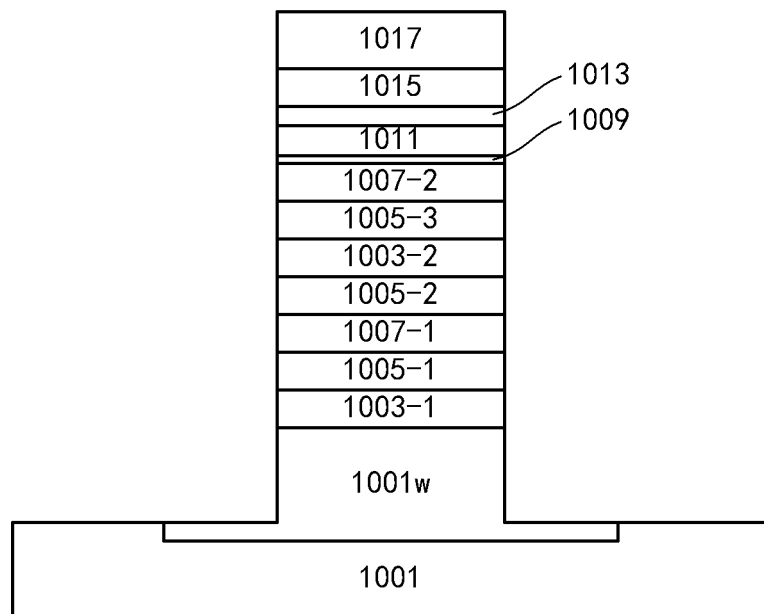

The pattern of the photoresist 1017 may be subsequently transferred into the hard mask layer and then into the underlying semiconductor layers. Specifically, as shown in FIG. 4, with the patterned photoresist as a mask, the hard mask layer, the source/drain layer 1007-2, the channel layer 1005-3, the source/drain layer 1003-2, the channel layer 1005-2, the source/drain layer 1007-1, the channel layer 1005-1, the source/drain layer 1003-1 may be selectively etched sequentially by, for example, reactive ion etching (RIE). In this example, the etching is performed into the substrate 1001 (but not to the bottom surface of the well region 1001w), so as to form a trench in the substrate 1001, in which shallow trench isolation (STI) may be formed subsequently. The source/drain layers and the channel layers after being etched form a pillar (in this example, a hexahedral pillar with a rectangular cross section), defining the active region. The RIE may be performed for example in the direction generally perpendicular to the substrate surface, and thus the pillar is also generally perpendicular to the substrate surface. Then, the photoresist 1017 may be removed. So far, the respective layers in the active region may have their outer peripheral sidewalls substantially coplanar with an outer peripheral sidewall of the hard mask layer. In the subsequent process, the layers in the active region may have their respective shapes adjusted as desired (by, for example, recessing the sidewalls thereof).

Figure 5A:
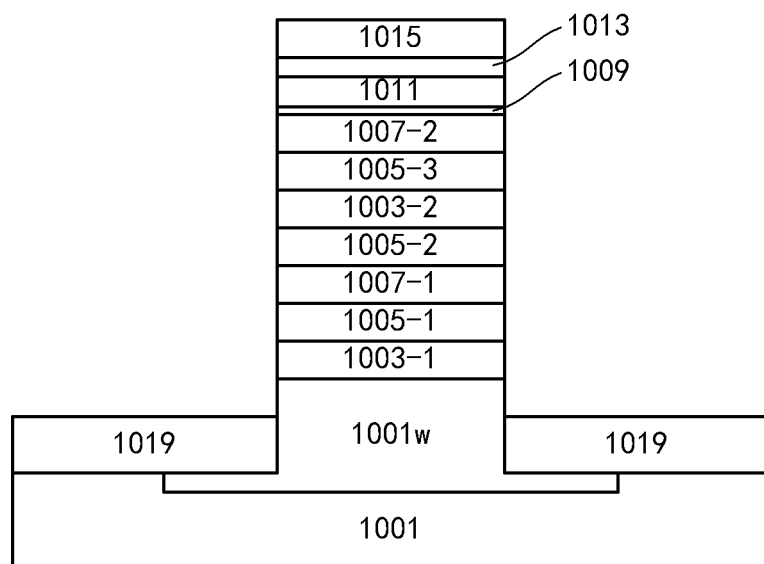
Figure 5B:
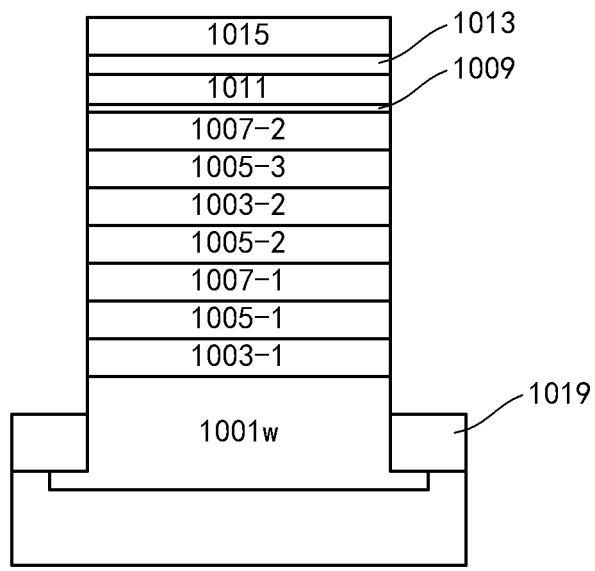

In the trench formed in the substrate 1001, a dielectric material may be filled to form the STI. For example, as shown in FIGS. 5(a) and 5(b), oxide may be deposited on the structure shown in FIG. 4, planarized by, for example, chemical mechanical polishing (CMP) (with the hard mask layer, for example, the second mask sub-layer 1015, as a stop layer), and then etched-back (by, for example, wet etching, vapor etching, vapor HF, or the like) to form the STI 1019. The STI 1019 is formed around the active region, to achieve electrical isolation among active regions. Here, the STI 1019, after being etched back, may have a top surface lower than that of substrate 1001, and thus the STI 1019 may expose a part of the well region 1001W.

Figure 6A:
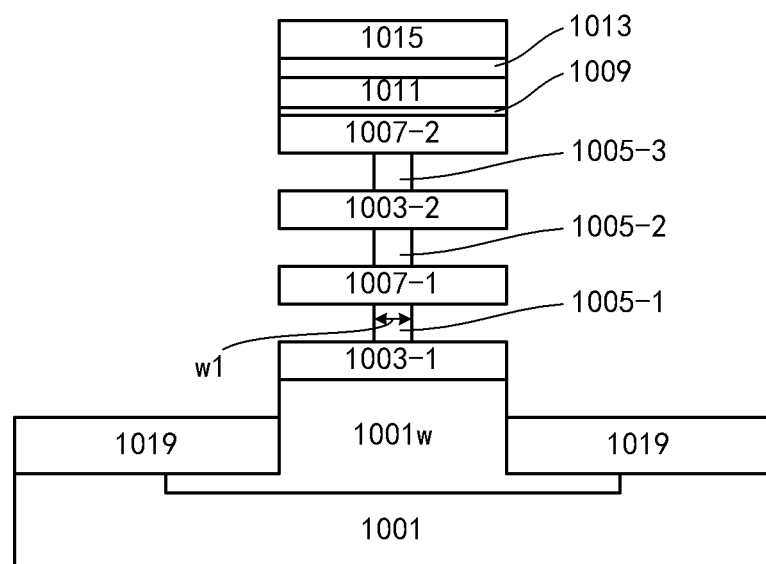
Figure 6B:
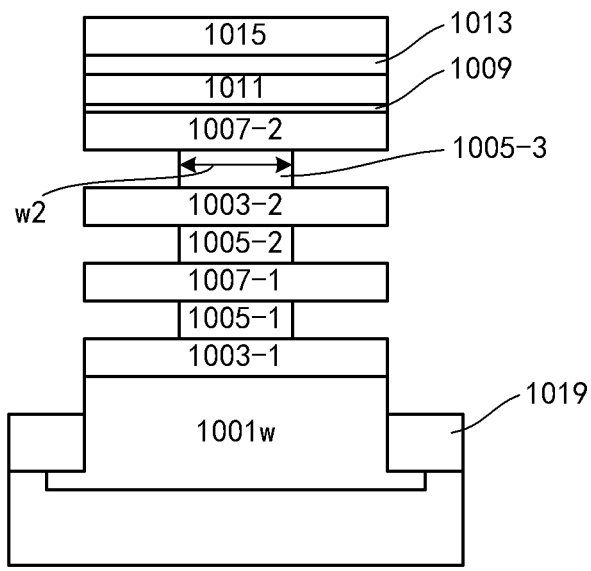

Then, as shown in FIGS. 6(*a*) and 6(*b*), the outer peripheral sidewalls of the channel layers may be recessed with respect to the outer peripheral sidewall of the hard mask layer (in this example, in a lateral direction generally parallel to the substrate surface), so that gate stacks may be formed subsequently within the range defined by the hard mask layer. This is advantageous, because the outer peripheral sidewall of the hard mask layer may be used as a reference to define relative recess and protrusion of the respective layers in the active region and gate stacks. In one example, this may be realized by further selectively etching the channel layers 1005-1, 1005-2, 1005-3 with respect to the respective source/drain layers. As described above, due to the etch selectivity between the channel layers and the source/drain layers, such selective etching can be achieved. The selective etching can be performed in a precise and controllable way by use of atomic layer etch (ALE) or digital etch.

Such recesses of the outer peripheries of the respective channel layers with respect to the outer peripheries of the source/drain layers facilitate the subsequent formation of the gate stacks. However, the present disclosure is not limited thereto. The outer peripheral sidewalls of the channel layers may be recessed with respect to the outer peripheral sidewall of the hard mask layer (so that the hard mask layer may be used as a reference), but not recessed with respect to the outer peripheral sidewalls of the source/drain layers (by, for example, etching the source/drain layers and channel layers to the generally same extent). In such a case, the gate stacks may be formed also around the outer periphery of the channel layers. There are various ways in the art to form the gate stacks for the vertical type device, and detailed descriptions thereof will be omitted here.

In this example, it is assumed, without considering anisotropy, that the selective etching of the channel layers 1005-1, 1005-2, 1005-3 is performed substantially identically in each direction. Therefore, the channel layers 1005-1, 1005-2, 1005-3 after being etched are still substantially rectangular in shape. For example, the rectangle has a short side with a length of w1, and a long side with a length of w2. It is possible to control electrostatic characteristics of the device such as short channel effects by w1, and to define a width of the device or an amount of current that can be conducted by w2.

Figure 7A:
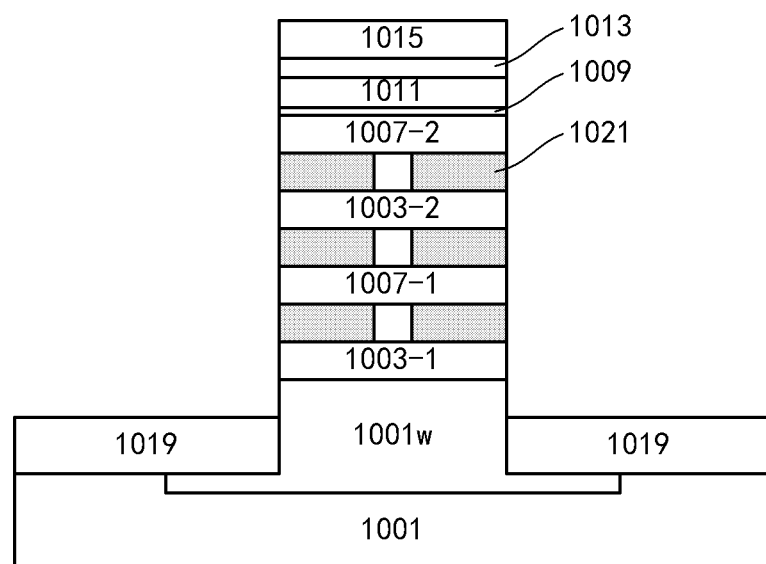
Figure 7B:
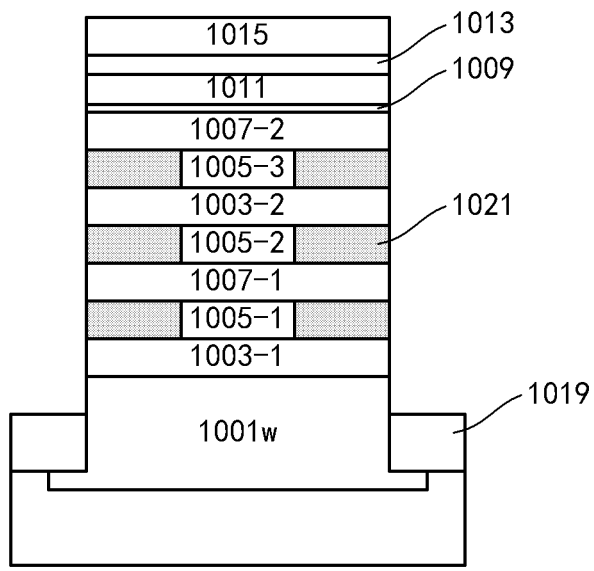

In the recesses of the respective channel layers with respect to the outer peripheries of the source/drain layers, the gate stacks are to be formed subsequently. In order to prevent the subsequent process from impacting the channel layers or leaving unnecessary material(s) in the recesses so as not to affect the subsequent formation of the gate stacks, a material layer may be filled in the recesses to occupy the space for the gate stacks (therefore, the material layer may be called a "sacrificial gate"). For example, oxynitride (for example, silicon oxynitride) or silicon carbide (different from the material of the hard mask layer so that selectively etching can be conducted subsequently) may be deposited on the structure shown in FIGS. 6(*a*) and 6(*b*), and then the deposited oxynitride or silicon carbide may be etched back by, for example, RIE. The RIE may be performed in a direction generally perpendicular to the substrate surface, and thus the oxynitride or silicon carbide may be left only in the recesses to form sacrificial gates 1021, as shown in FIGS. 7(*a*) and 7(*b*). In such a case, the sacrificial gates 1021 may substantially fill up the respective recesses.

Then, the source/drain layers may have their shapes adjusted to achieve the required relative recess/protrusion. In order to achieve the parallel connection, the source/drain layers on an upper side and a lower side of one same channel layer need to be connected to different electrically conductive channels, and thus need to be protruded at different regions.

Figure 8A:
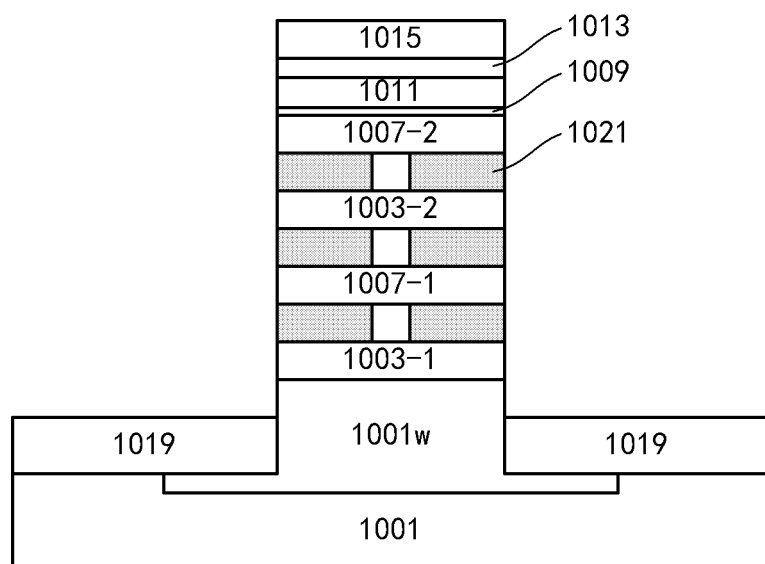
Figure 8B:
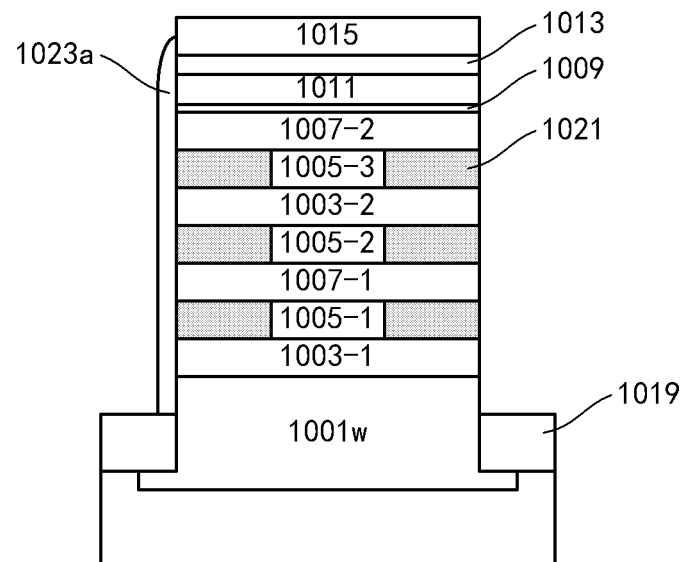

To do this, as shown in FIGS. 8(*a*) and 8(*b*), a first shielding layer 1023*a* may be formed at the region where the source/drain layers 1003-1 and 1003-2 need to be relatively protruded (referred to as "a first region"), so as to shield the sidewalls of the source/drain layers 1003-1 and 1003-2. For example, in the structure shown in FIGS. 7(*a*) and 7(*b*), a spacer may be formed on the STI 1019 around sidewalls of those protruding elements with respect to the STI 1019 (specifically, the portion of the substrate protruding above STI 109, the sacrificial gates 1021, and the respective source/drain layers) by a spacer formation process (for example, conformal deposition followed by RIE in the vertical direction). For example, the spacer may comprise Si. Then, photoresist may be formed to shield a portion of the spacer at the first region but to expose the remaining portion of the spacer. The exposed portion of the spacer may be removed by selective etching such as RIE, and thus the portion of the spacer at the first region may be left to form the first shielding layer 1023*a*. After that, the photoresist may be removed.

In this example, the first shielding layer 1023*a* is formed only at a lower edge in the top view shown in FIG. 3(*a*) (or, accordingly a left edge in FIG. 8(*b*)), so that subsequently the source/drain layers 1003-1 and 1003-2 may protrude relatively at this location. However, the present disclosure is not limited thereto. The first shielding layer 1023*a* may shield more of the sidewalls of the source/drain layers 1003-1 and 1003-2. For example, the first region may include a plurality of separated sub-regions. This can improve the device performances, for example, RC delay.

Figure 9A:
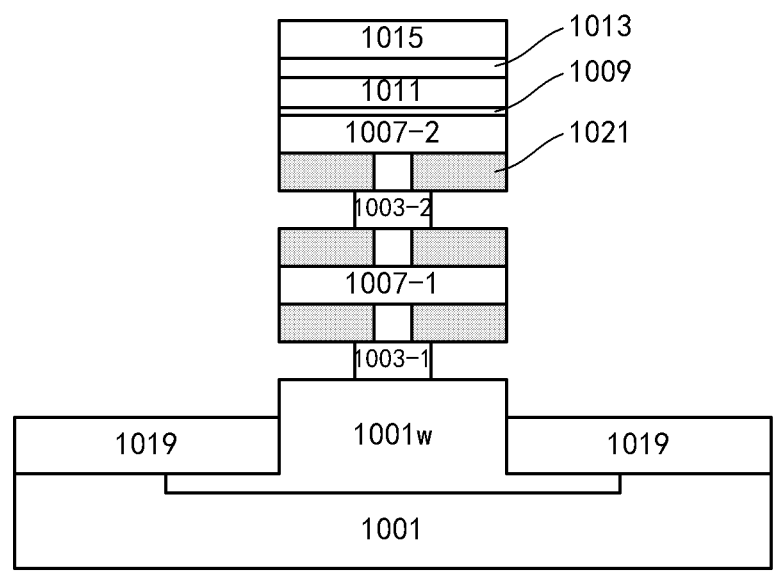
Figure 9B:
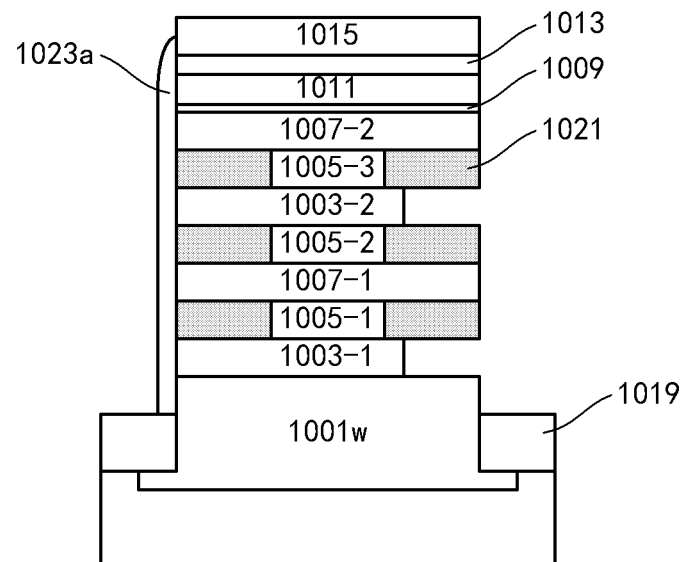

Then, as shown in FIGS. 9(*a*) and 9(*b*), the outer peripheral sidewalls of the source/drain layers 1003-1 and 1003-2 may be recessed with respect to the outer peripheral sidewall of the hard mask layer. This may be achieved by selectively etching the source/drain layers 1003-1 and 1003-2. Due to the presence of the first shielding layer 1023*a*, the sidewalls of the source/drain layers 1003-1 and 1003-2 are not recessed at the first region, and thus are relatively protruded.

In the figures, it is illustrated that the outer peripheral sidewalls of the source/drain layers 1003-1 and 1003-2 after being etched are still relatively protruded with respect to the outer peripheral sidewalls of the channel layers. However, the present disclosure is not limited thereto. For example, the outer peripheral sidewalls of the source/drain layers 1003-1 and 1003-2 after being etched may be substantially aligned with or even relatively recessed with respect to the outer peripheral sidewalls of the channel layers. In order to avoid damaging the channel layers, an etching recipe for the source/drain layers 1003-1 and 1003-2 may be selected to have substantially no effects on the channel layers. Subsequently, the first shielding layer 1023*a* may be removed by selective etching such as RIE.

Figure 10A:
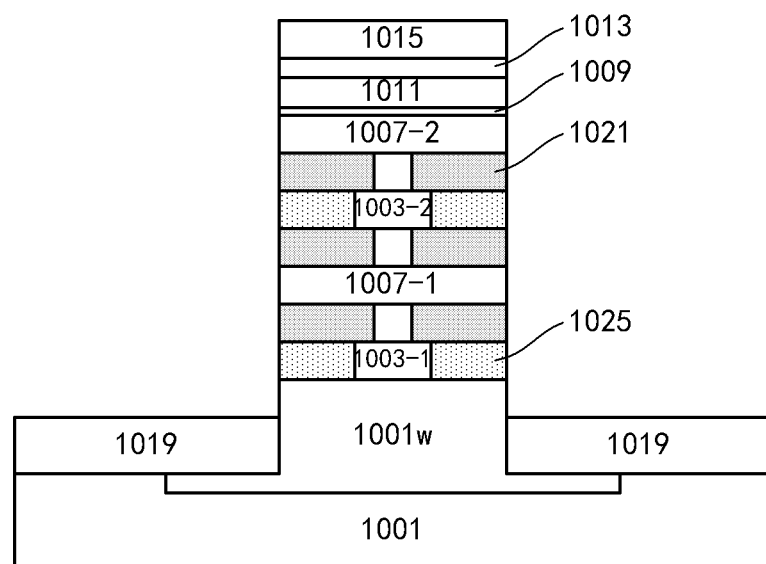
Figure 10B:
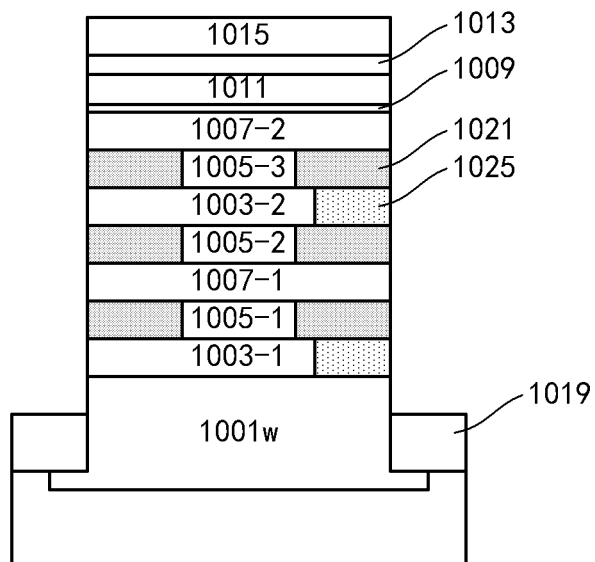

For the source/drain layers 1003-1 and 1003-2, an isolation layer 1025 may be formed around them. For example, as shown in FIGS. 10(*a*) and 10(*b*), the isolation layer 1025 may be formed by depositing a dielectric layer, especially a low k dielectric layer such as low k silicon carbide, on the structure shown in FIGS. 9(*a*) and 9(*b*) (with the first shielding layer 1023*a* removed) followed by etching-back. The etching-back may be performed by RIE in the vertical direction, and thus the isolation layer 1025 may be left below the hard mask layer, while having its outer peripheral sidewall substantially coplanar with the outer peripheral sidewall of the hard mask layer. Therefore, the other portions of the sidewalls of the source/drain layers 1003-1 and 1003-2 than that exposed at the first region are covered by the isolation layer 1025. Such the isolation layer 1025 may be self-aligned to the source/drain layers 1003-1 and 1003-2.

Next, the remaining source/drain layers 1007-1 and 1007-2 may be processed similarly.

Figure 11A:
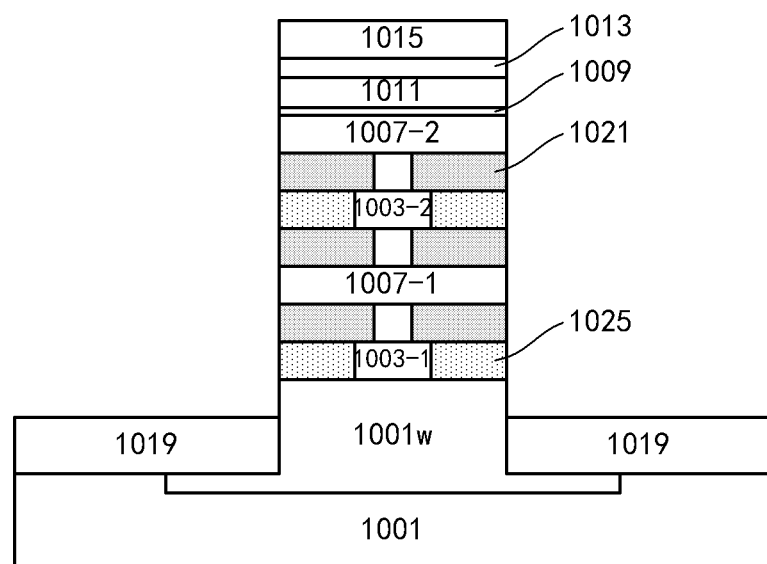
Figure 11B:
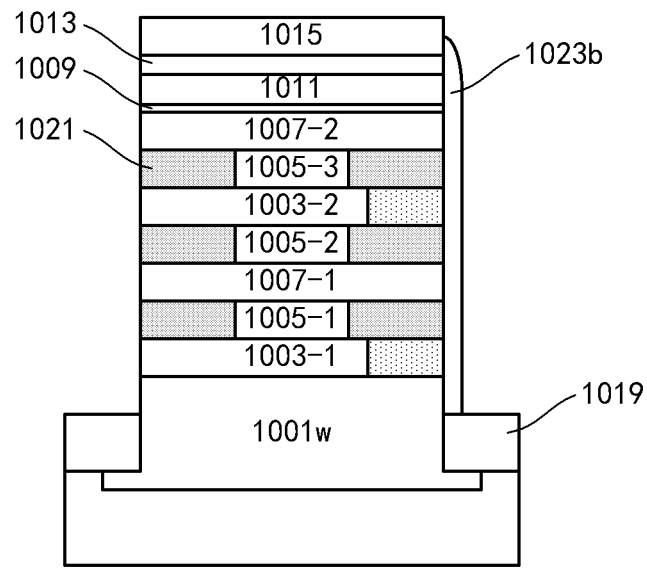

For example, as shown in FIGS. 11(*a*) and 11(*b*), a second shielding layer 1023*b* may be formed at the region where the source/drain layers 1007-1 and 1007-2 need to be relatively protruded (referred to as "a second region"), so as to shield the sidewalls of the source/drain layers 1007-1 and 1007-2. For example, in the structure shown in FIGS. 10(*a*) and 10(*b*), a spacer may be formed on the STI 1019 around the sidewalls of those protruding elements with respect to the STI 1019 (specifically, the portion of the substrate protruding above STI 109, the sacrificial gates 1021, the isolation layer 1025, and the respective source/drain layers) by a spacer formation process (for example, conformal deposition followed by RIE in the vertical direction). For example, the spacer may comprise SiGe. Then, photoresist may be formed to shield a portion of the spacer at the second region but to expose the remaining portion of the spacer. The exposed portion of the spacer may be removed by selective etching such as RIE, and thus the portion of the spacer at the second region may be left to form the second shielding layer 1023*b*. After that, the photoresist may be removed.

In this example, the second shielding layer 1023*b* is formed only at an upper edge in the top view shown in FIG. 3(*a*) (or, accordingly a right edge in FIG. 11(*b*)), so that subsequently the source/drain layers 1007-1 and 1007-2 may protrude relatively at this location. However, the present disclosure is not limited thereto. The second shielding layer 1023*b* may shield more of the sidewalls of the source/drain layers 1007-1 and 1007-2. For example, the second region may include a plurality of separated sub-regions. This can improve the device performances, for example, RC delay.

Here, the first region and the second region are disposed opposite to each other, in order to avoid as much as possible the mutual interference between the electrically conductive channels to be formed subsequently and respectively in these two regions.

Figure 12A:
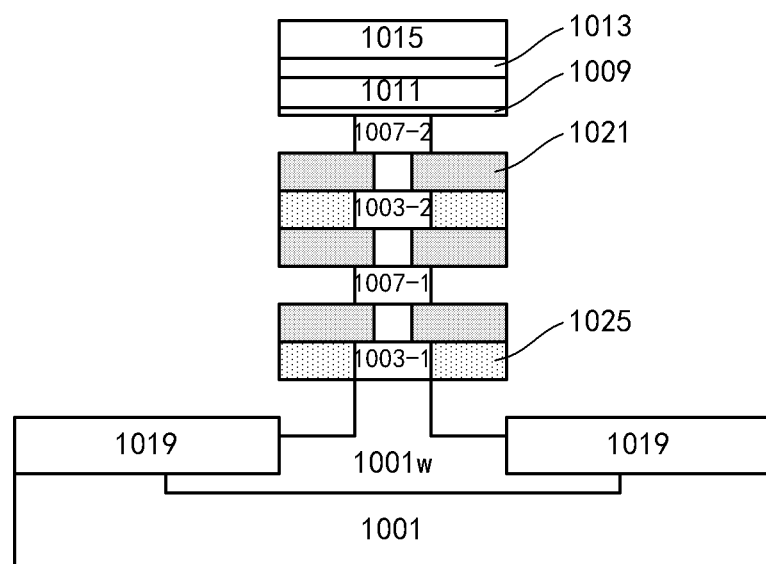
Figure 12B:
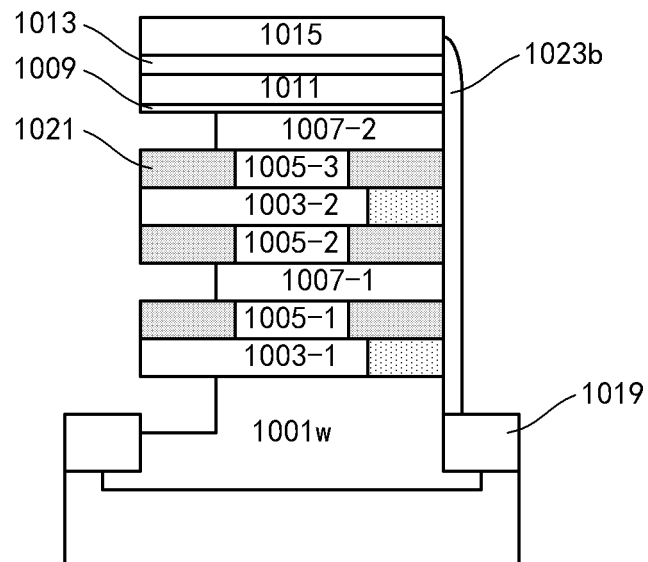

Then, as shown in FIGS. 12(*a*) and 12(*b*), the outer peripheral sidewalls of the source/drain layers 1007-1 and 1007-2 may be recessed with respect to the outer peripheral sidewall of the hard mask layer. This may be achieved by selectively etching the source/drain layers 1007-1 and 1007-2 (by, for example, wet etching with TMAH solution). Due to the presence of the second shielding layer 1023*b*, the sidewalls of the source/drain layers 1007-1 and 1007-2 are not recessed at the second region, and thus are relatively protruded.

In the figures, it is illustrated that the outer peripheral sidewalls of the source/drain layers 1007-1 and 1007-2 after being etched are still relatively protruded with respect to the outer peripheral sidewalls of the channel layers. However, the present disclosure is not limited thereto. For example, the outer peripheral sidewalls of the source/drain layers 1007-1 and 1007-2 after being etched may be substantially aligned with or even relatively recessed with respect to the outer peripheral sidewalls of the channel layers. In order to avoid damaging the channel layers, an etching recipe for the source/drain layers 1007-1 and 1007-2 may be selected to have substantially no effects on the channel layers. Subsequently, the second shielding layer 1023*b* may be removed by selective etching such as RIE.

In addition, in this example, because the substrate 1001 comprises the same material (Si) as the source/drain layers 1007-1 and 1007-2, the substrate 1001 may be also etched. Here, the etching is stopped before the bottom of the well region 1001*w*.

Figure 13A:
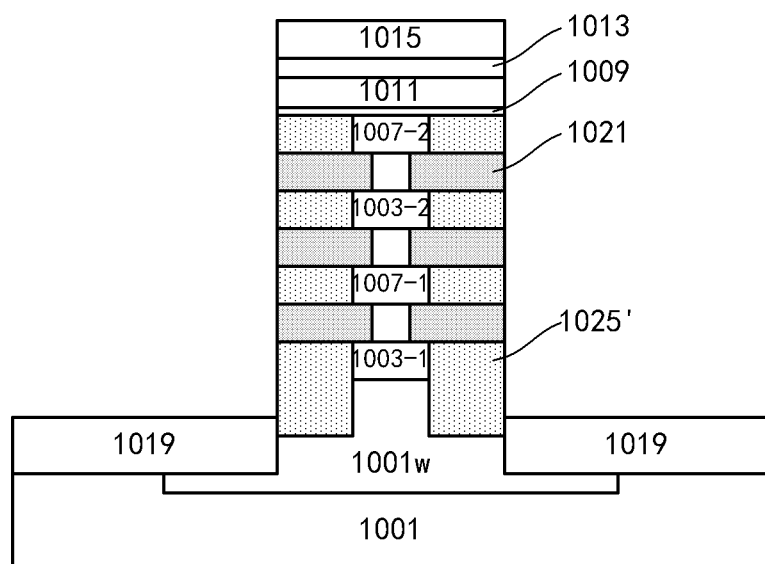
Figure 13B:
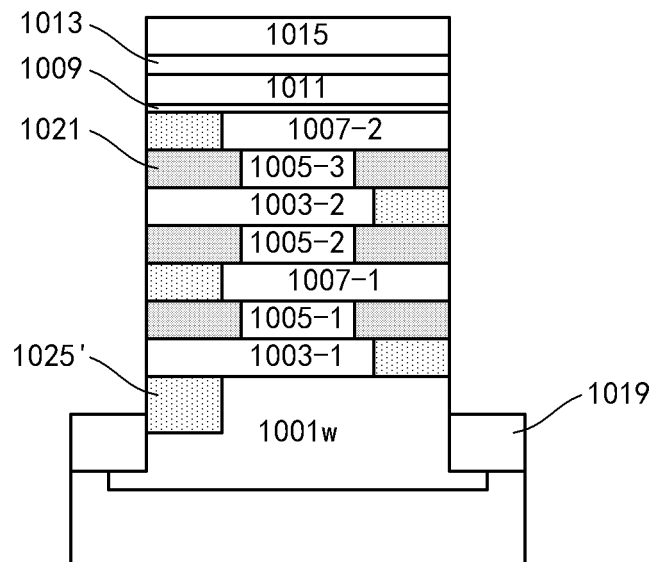

For the source/drain layers 1007-1 and 1007-2, an isolation layer may be formed around them. For example, as shown in FIGS. 13(*a*) and 13(*b*), the isolation layer may be formed by depositing a dielectric layer, especially a low k dielectric layer such as low k silicon carbide, on the structure shown in FIGS. 12(*a*) and 12(*b*) (with the second shielding layer 1023*b* removed) followed by etching-back. The isolation layer formed hereby and the isolation layer 1025 previously formed may comprise the same material, and thus are collectively shown as 1025'. The etching back may be performed by RIE in the vertical direction, and thus the isolation layer 1025' may be left below the hard mask layer, while having tis outer peripheral sidewall substantially coplanar with the outer peripheral sidewall of the hard mask layer. Therefore, the other portions of the sidewalls of the source/drain layers 1007-1 and 1007-2 than that exposed at the second region are covered by the isolation layer 1025'. Such the isolation layer may be self-aligned to the source/drain layers 1007-1 and 1007-2.

According to other embodiments, in order to improve electrical contact characteristics, metal silicide may be formed on the surfaces of the source/drain layers. For example, the isolation layer 1025' may not be formed, and instead the isolation layer 1025 may be removed. Therefore, the sidewalls of the respective source/drain layers 1003-1, 1003-2, 1007-1, and 1007-2 may be exposed. Then, a metal layer such as Ni or NiPt may be formed by deposition, for example, chemical vapor deposition (CVD), atomic layer epitaxy (ALE), physical vapor deposition (PVD), or the like, and then subjected to annealing for silicidation, resulting in metal silicide such as NiPtSi. Then, the metal layer unreacted may be removed. After that, the isolation layer 1025' described above may be formed.

After adjusting the shapes of the source/drain layers, an replacement gate process may be performed.

Figure 14A:
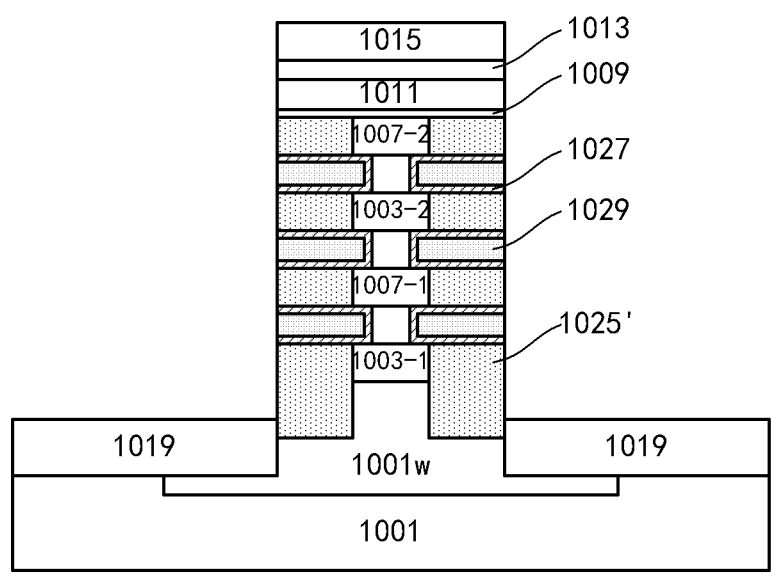
Figure 14B:
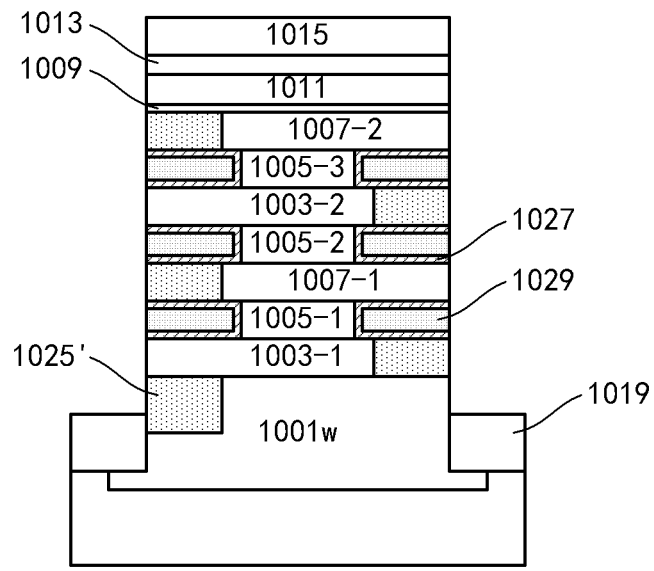

For example, as shown in FIGS. 14(*a*) and 14(*b*), the sacrificial gates 1021 may be removed by selective etching, so as to release the space in the recesses, and the gate stacks may be formed in the released space. Specifically, a gate dielectric layer 1027 and a gate conductor layer 1029 may be subsequently deposited on the structure shown in FIGS. 13(*a*) and 13(*b*) (with the sacrificial gate 1021 removed), and the deposited gate conductor layer 1029 (and optionally the gate dielectric layer 1027) may be etched back. The etching-back may be performed by RIE in the vertical direction, and thus the gate stacks may be left below the hard mask layer, while having their respective outer peripheral sidewalls substantially coplanar with the outer peripheral sidewall of the hard mask layer. For example, the gate dielectric layer 1027 may comprise high-k gate dielectric such as $HfO_2$, and the gate conductor layer 1029 may comprise a metal gate conductor. In addition, a work function adjustment layer may be formed between the gate dielectric layer 1027 and the gate conductor layer 1029. Before forming the gate dielectric layer 1027, an interface layer of, for example, oxide may be formed.

Because the sidewalls of the source/drain layers 1003-1, 1003-2 and the sidewalls of the gate stacks, especially those of the gate conductor layer 1029, are now substantially coplanar in the first region (see the left sidewalls in FIG.

14(*b*)), a first electrically conductive channel to the source/ drain layers 1003-1, 1003-2, if formed, will also contact the gate conductor layer 1029. In order to avoid such a case, the sidewalls of the gate stacks, especially those of the gate conductor layer 1029, may be relatively recessed at least in the first region. In addition, because the sidewalls of the source/drain layers 1007-1, 1007-2 and the sidewalls of the gate stacks, especially those of the gate conductor layer 1029, are now substantially coplanar in the second region (see the right sidewalls in FIG. 14(*b*)), a second electrically conductive channel to the source/drain layers 1007-1, 1007-2, if formed, will also contact the gate conductor layer 1029. In order to avoid such a case, the sidewalls of the gate stacks, especially those of the gate conductor layer 1029, may be relatively recessed at least in the second region. In addition, in order to form a third electrically conductive channel to the gate conductor layer 1029, the gate conductor layer 1029 may be relatively protruded at a third region different from the first region and the second region.

Figure 15A:
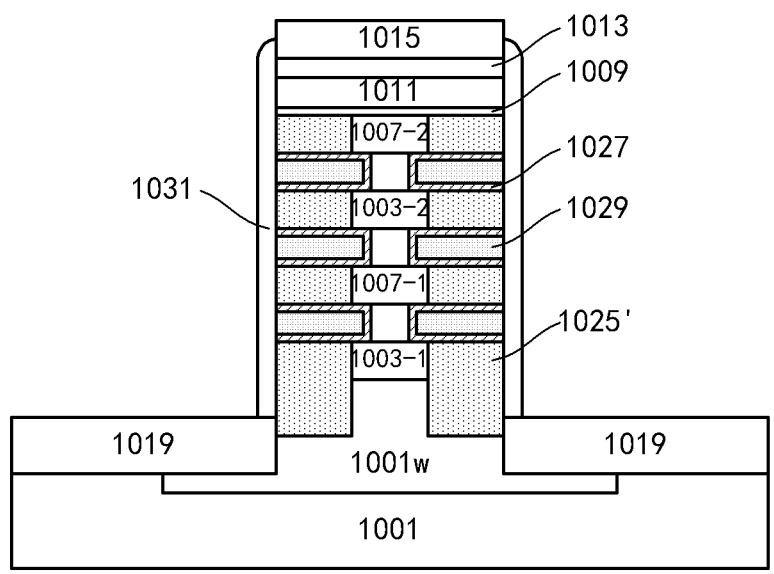
Figure 15B:
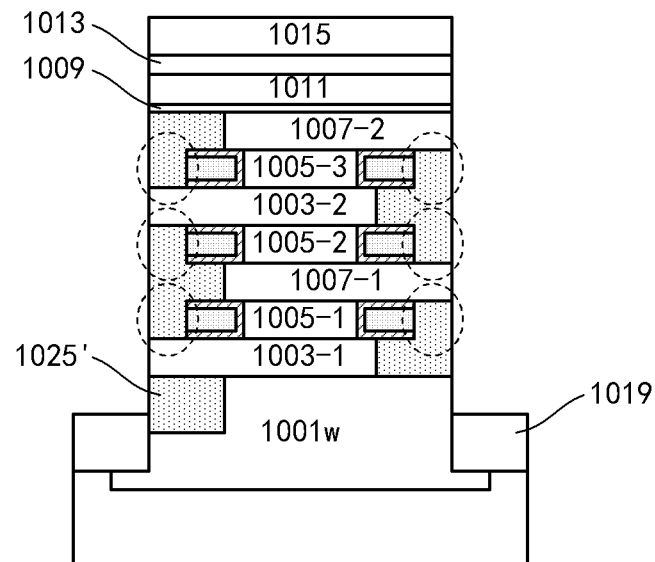

To do this, as shown in FIGS. 15(*a*) and 15(*b*), a third shielding layer 1031 may be formed. The third shielding layer 1031 may be formed at a second region different from the first region and the second region, to expose the sidewalls of the gate stack at least at the first region and the second region. For example, in the structure shown in FIGS. 14(*a*) 14(*b*), a spacer may be formed on the STI 1019 around sidewalls of those protruding elements with respect to the STI 1019 (specifically, the portion of the substrate protruding above STI 1019, the isolation layer, the gate stacks, and the hard mask layer) by a spacer formation process. For example, the spacer may comprise oxide.

In this example, the third shielding layer 1031 is formed at edges on the left and right sides in the top view illustrated in FIG. 3(*a*) (or, accordingly edges on the left and right sides in FIG. 15(*a*)), so as to avoid mutual interference between the third electrically conductive channels to be formed at the third region and the first electrically conductive channel and the second electrically conductive channel to be formed respectively at the first region and the second region. However, the present disclosure is not limited thereto. The third shielding layer 1031 may shield more of the sidewall of the gate stacks. For example, the third region may include a plurality of separated sub-regions. This can improve the device performances, for example, RC delay.

Then, the outer peripheral sidewalls of the gate stacks may be recessed with respect to the outer peripheral sidewall of the hard mask layer. This may be achieved by etching back the gate dielectric layer 1027 and the gate conductor layer 1029. Then, the third shielding layer 1031 may be removed.

Due to the third shielding layer 1031, the sidewalls of the gate stacks are recessed at least at the first region and the second region (see dotted circles in FIG. 15(*b*)), such that the source/drain layers 1003-1 and 1003-2 are protruded with respect to the gate stacks and the source/drain layers 1007-1 and 1007-2 at the first region and that the source/drain layers 1007-1 and 1007-2 are protruded with respect to the gate stacks and the source/drain layers 1003-1 and 1003-2 at the second region. In addition, at the third region, due to the presence of the third shielding layer 1031, the gate stacks are not recessed and thus protruded with respect to the source/ drain layers 1003-1 and 1003-2 and the source/drain layers 1007-1 and 1007-2, so as to subsequently contact the third electrically conductive channel to the gate stack.

After etching back the gate stacks, a dielectric material may be further filled in the space produced by the etching-back (see the dotted circles in FIG. 15(*b*)). The dielectric material may be same as that in the isolation layer 1025', and thus they are not distinguished from each other in the drawings.

Figure 16A:
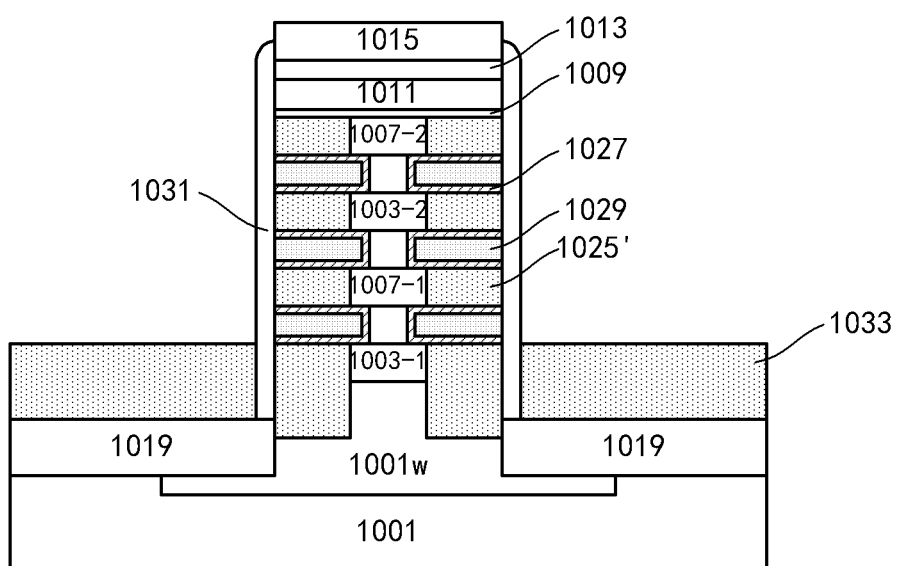
Figure 16B:
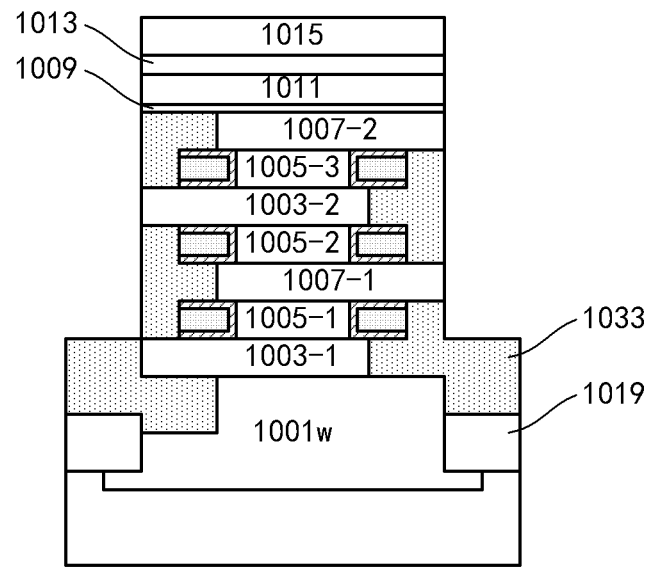

In addition, as shown in FIG. 15(*b*), the top surface of the STI 1019 may be lower than the top surface of the substrate 1001, and thus some part of the substrate may be exposed. In this example, the substrate 1001 is exposed at the second region. Further, the substrate 1001 and the source/drain layer 1003-1 contact each other. Therefore, when the second electrically conductive channel to the source/drain layers 1007-1 and 1007-2 is formed subsequently at the second region, the second electrically conductive channel may form a short-circuit with the source/drain layer 1003-1 through the exposed part of the substrate, which is undesirable. To do this, as shown in FIGS. 16(*a*) and 16(*b*), another isolation layer 1033 may be formed on the STI 1019, so as to cover the exposed surface of the substrate 1001. For example, the isolation layer 1033 may be formed by depositing SiC, planarizing the deposited SiC by, for example, CMP (which may be stopped at the hard mask layer), and then etching back SiC. The isolation layer 1033 may, on one hand, need to expose the sidewalls of the source/drain layers 1007-1, 1007-2 (implying that a top surface thereof may not be higher than the bottom surface of the lower source/drain layer 1007-1), and, on the other hand, be capable of shielding possible paths to the source/drain layer 1003-1 (implying that the top surface thereof may not be lower than the top surface of the source/drain layer 1003-1). Here, the isolation layer 1033 may comprise a material different from the third shielding layer 1031, so as to prevent the etching back thereof from removing the third shielding layer 1031.

Figure 17A:
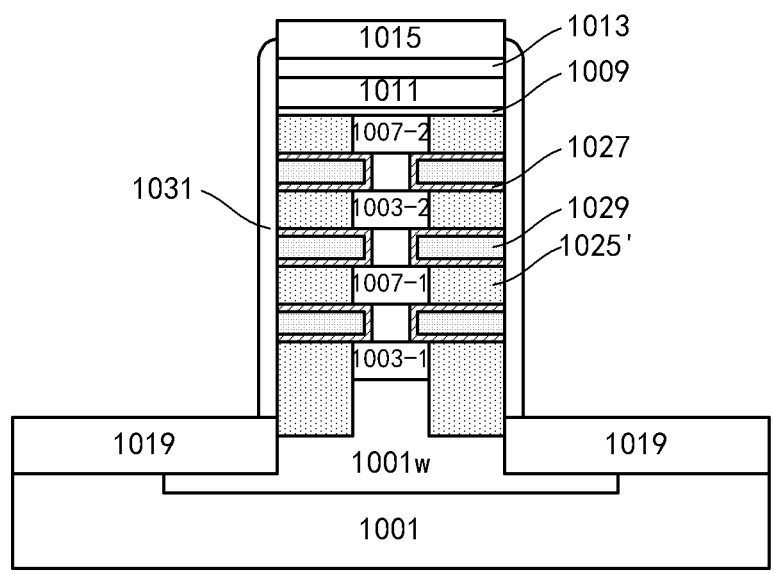
Figure 17B:
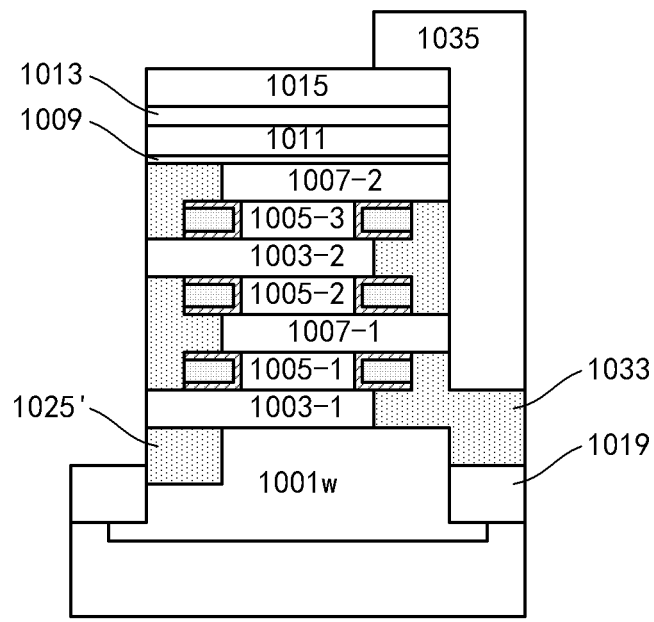
Figure 17C:
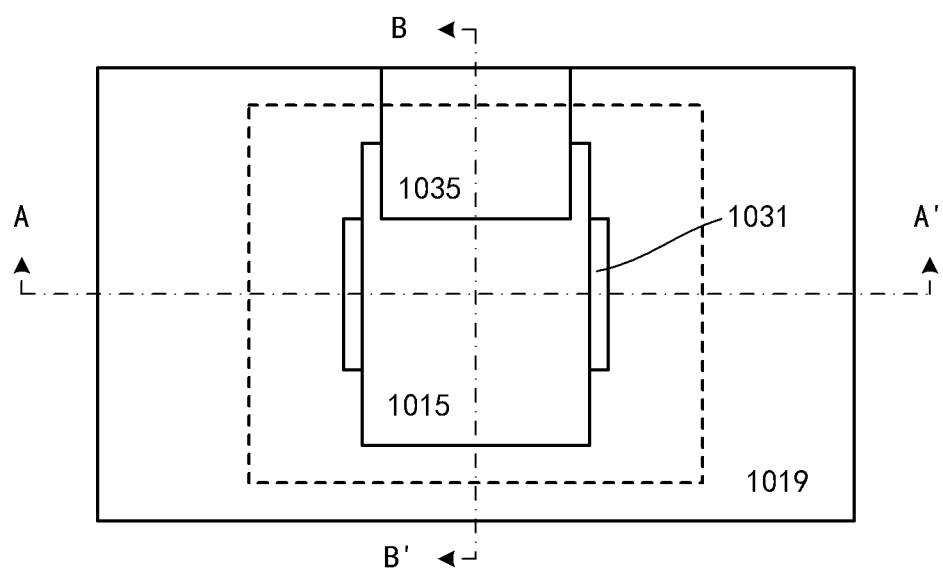

However, the isolation layer 1033 formed in such a way also covers the sidewall of the source/drain layer 1003-1 in the first region. The sidewall of the source/drain layer 1003-1 needs to be exposed at the first region, to enable contact between it and the first electrically conductive channel to be formed at the first region. For example, as shown in FIGS. 17(*a*), 17(*b*) and 17(*c*), a shielding layer 1035, for example, photoresist, may be formed to at least cover the isolation layer 1033 in the second region and to at least expose the isolation layer 1033 in the first region. Subsequently, the isolation layer 1033 may be selectively etched by, for example, RIE. The RIE may stop at the STI 1019. Therefore, the sidewall of the source/drain layer 1003-1 is exposed at the first region.

Then, the shielding layer 1035 and the third shielding layer 1031 may be removed.

Due to the above processes, a protruding structure defined by the hard mask layer is formed above the STI 1019. The protruding structure has most of its outer periphery covered by the isolation layer 1025' (and the isolation layer 1033). The electrically conductive channels may be formed subsequently on the surface of the isolation layer 1025'. At the first region, the source/drain layers 1003-1, 1003-2 are protruded with respect to the source/drain layers 1007-1, 1007-2 and gate stacks; at the second region, the source/drain layers 1007-1, 1007-2 are protruded with respect to the source/ drain layers 1003-1, 1003-2 and gate stacks; and at the third region, the gate stacks are protruded with respect to the source/drain layers 1003-1, 1003-2 and the source/drain layers 1007-1, 1007-2. The sidewalls of these protruded parts are substantially coplanar to the sidewall of the hard mask layer, and exposed at the surface of the isolation layer 1025'. Therefore, the electrically conductive channels to be formed subsequently on the surface of the isolation layer 1025' may contact the sidewalls of these protruded parts.

Figure 18A:
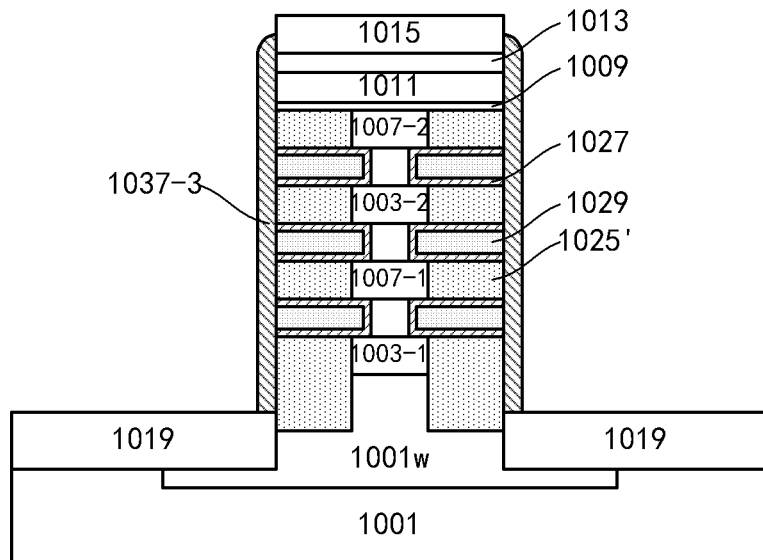
Figure 18B:
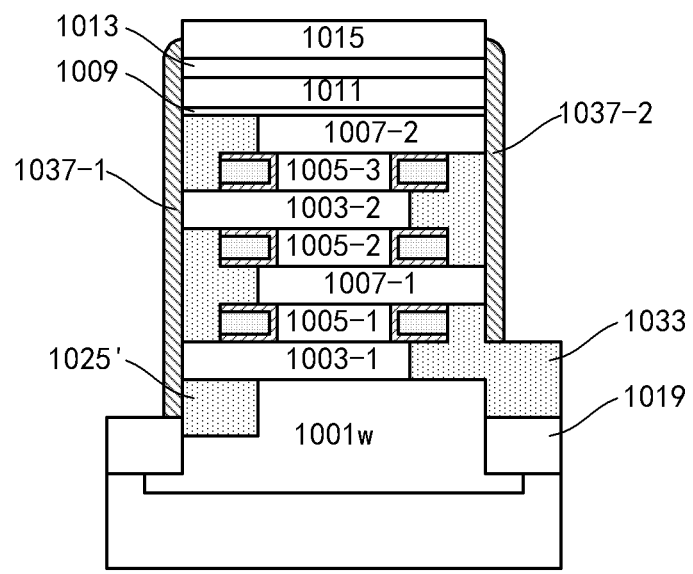
Figure 18C:
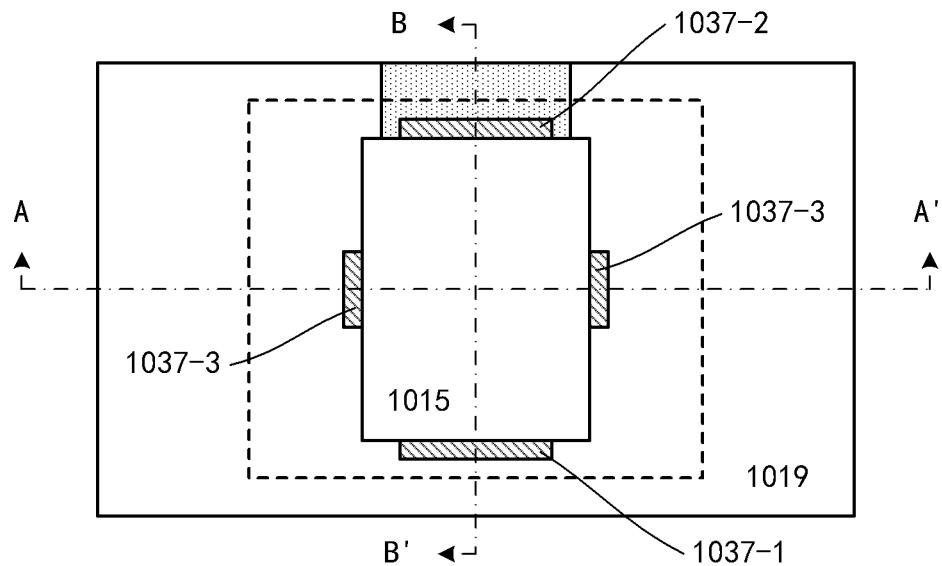

As shown in FIGS. 18(*a*), 18(*b*) and 18(*c*), the first electrically conductive channel 1037-1, the second electrically conductive channel 1037-2, and the third electrically conductive channel 1037-3 may be formed on the surface of the isolation layer through an electrically conductive material such as metal (for example, at least one of W, Co, or Ru) or metal silicide (for example, at least one of NiSi, NiPtSi, PtSi, CoSi, CoSi$_2$, TiSi, or TiSi$_2$) by, for example, a spacer formation process in combination with photolithography. The first electrically conductive channel 1037-1, the second electrically conductive channel 1037-2, and the third electrically conductive channel 1037-3 may be formed respectively at the first region, the second region, and the third region, to contact the source/drain layers 1003-1, 1003-2 exposed at the first region, the source/drain layers 1007-1, 1007-2 exposed at the second region, and the gate stacks exposed at the third region, respectively. Here, the electrically conductive channels may be formed on respective sides (e.g., four sides) of the hard mask layer (e.g., rectangle), as shown in the top view of the FIG. 18(*c*). The electrically conductive channels may contact the sidewalls of the source/drain layers and the gate stacks (especially the gate conductor layer 1029 therein), respectively. In addition, the electrically conductive channels contact the sidewall of the electrically conductive material layer 1013.

In the case where at least one of the first region, the second region, or the third region includes separated sub-regions, the electrically conductive channels may be formed respectively in the sub-regions. In addition, the sizes of the electrically conductive channels may not necessarily be the same.

According to other embodiments, if silicide is not formed on the surfaces of the source/drain layers in the foregoing process, the source/drain layers may be silicided. For example, the gate stacks may be etched back and a shielding layer (having a material different from that of the isolation layer 1025') may be filled in the gap due to the etching-back. Then, the isolation layer 1025' may be removed, and the thus exposed surfaces of the source/drain layers may be silicided. Then, an isolation layer may be filled in the gap (some part thereof may be occupied by the silicide) due to the removal of the isolation layer 1025'. Then, the shielding layer may be removed from, for example, the third region, to expose the sidewalls of the gate stacks. Then, in forming the electrically conductive channels, the electrically conductive material may enter the gap due to the removal of the shielding layer to contact the sidewalls of the gate stacks.

According to other embodiments, the electrically conductive channels may have stress used to adjust the device performances. For example, for the n-type device, the electrically conductive channels may have compressive stress to create tensile stress in the channel layers; or alternatively, for the p-type device, the electrically conductive channels may have tensile stress to create compressive stress in the channel layers.

Figure 19A:
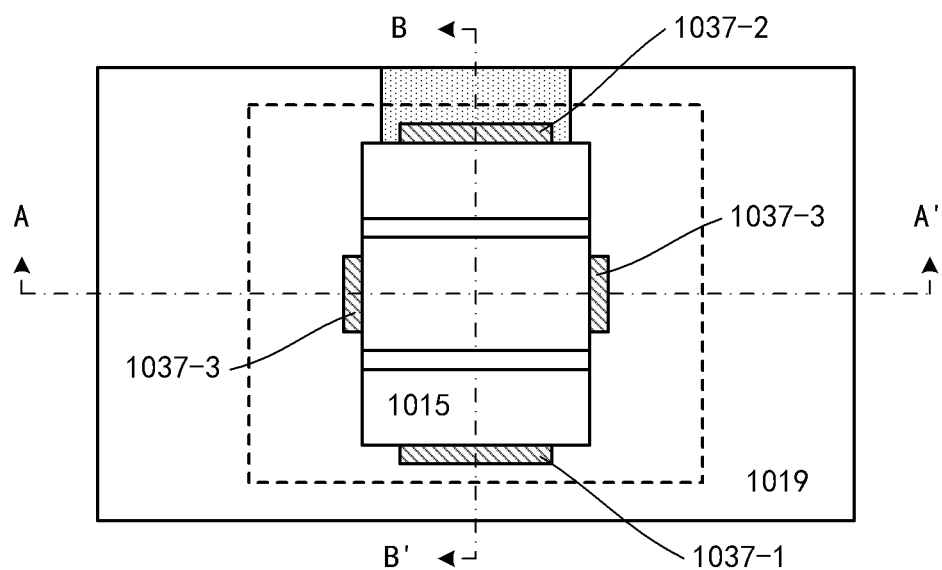
Figure 19B:
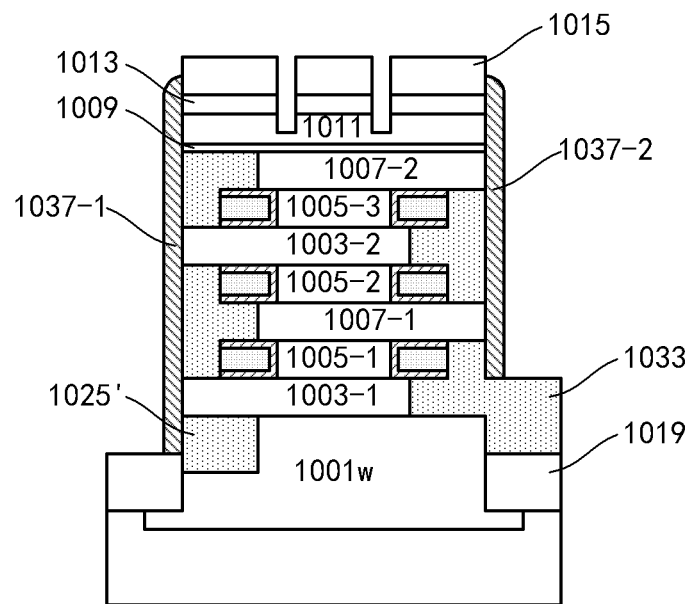

Then, the electrically conductive material layer 1013 may be patterned to achieve required electric isolation. For example, as shown in FIGS. 19(*a*) and 19(*b*), the electrically conductive material layer 1013 may be cut off along line AA', to be divided into three parts corresponding to the first electrically conductive channel 1037-1, the second electrically conductive channel 1037-2, and the third electrically conductive channel 1037-3, respectively. This may be achieved by selectively etching (with a cutting mask) the second mask sub-layer 1015 and the electrically conductive material layer 1013 sequentially by, for example, RIE.

Figure 20A:
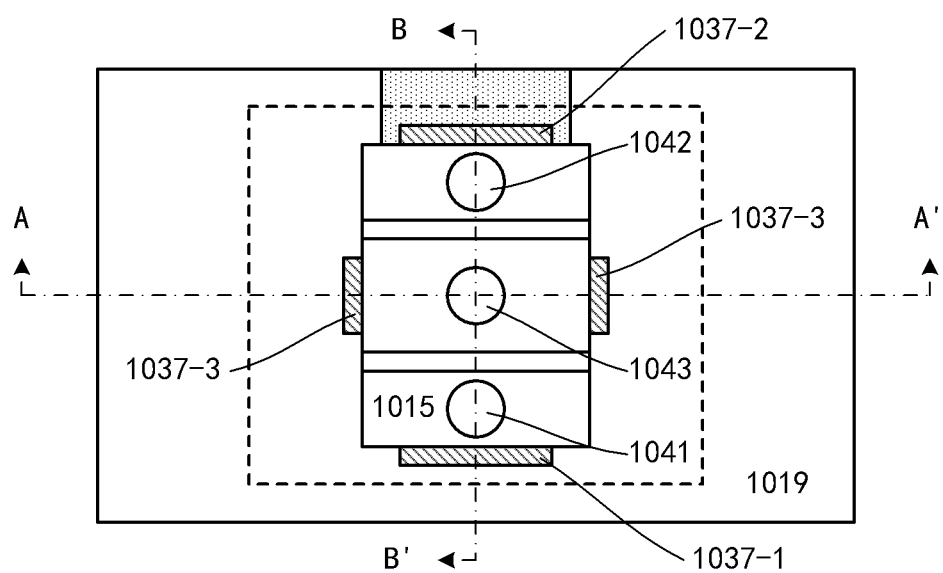
FIG. 20(a) is a top view.
Figure 20B:
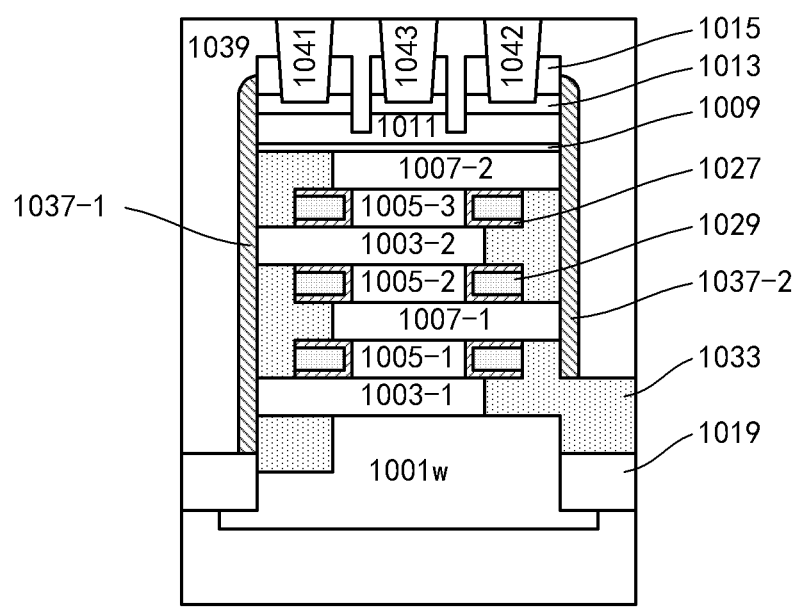
FIG. 20(b) is a cross-sectional view taken along line BB' in FIG. 20(a).

Then, as shown in FIGS. 20(*a*) and 20(*b*), an interlayer dielectric layer 1039 may be formed on the structure shown in FIGS. 19(*a*) and 19(*b*) (in FIG. 20(*a*), the interlayer dielectric layer 1039 is not shown for clarity). For example, the interlayer dielectric layer 1039 may be formed by depositing oxide and then planarizing it by, for example, CMP. In the interlayer dielectric layer 1039, contacts 1041, 1042, and 1043 may be formed. These contacts may be formed by etching holes and filling an electrically conductive material such as metal therein. The contact 1041 is electrically connected to the source/drain layers 1003-1, 1003-2 through the electrically conductive material layer 1013 and the first electrically conductive channel 1037-1; the contact 1042 is electrically connected to the source/drain layers 1007-1, 1007-2 through the electrically conductive material layer 1013 and the second electrically conductive channel 1037-2; and the contact 1043 is electrically connected to the gate conductor layer 1029 through the electrically conductive material layer 1013 and the third electrically conductive channel 1037-3.

In this example, the contacts 1041, 1042, and 1043 are arranged in a row generally along the longitudinal direction of the active region (the long side direction of the rectangular active region), so as to overlap with the main body of the active region as much as possible to save the footprint more while ensuring their spacing.

In this example, the contacts 1041, 1042, and 1043 are formed on the top of the active region. However, the present disclosure is not limited thereto. For example, only one or two of the contacts 1041, 1042, and 1043 may be formed on the top of the active region, while the other contact(s) may be offset in a lateral direction as in the conventional technology.

The semiconductor device according to embodiments of the present disclosure are applicable to various electronic devices. For example, by integrating a plurality of such semiconductor devices and also other devices (for example, other forms of transistors, etc.), an integrated circuit (IC) may be formed, and an electronic device may be manufactured thereby. Therefore, the present disclosure also provides an electronic device comprising the above described semiconductor device. The electronic device may also comprise components, such as a display screen cooperating with the integrated circuit and a wireless transceiver cooperating with the integrated circuit. Such an electronic device may comprise, for example, a smart-phone, a computer, a tablet computer (PC), a wearable smart device, a mobile power, or the like.

According to embodiments of the present disclosure, there is also provided a method of manufacturing a system on chip (SoC). The method may comprise the above described method of manufacturing the semiconductor device. Specifically, a plurality of types of devices may be integrated on the chip, at least some of which are manufactured according to the method of the present disclosure.

In the above description, technical details such as patterning and etching of each layer have not been described in detail. However, those skilled in the art should understand that layers, regions or the like in desired shapes can be formed in various ways. In addition, in order to form one same structure, those skilled in the art can also devise a method, which is not completely the same as the method described above. In addition, although the embodiments are respectively described above, this does not mean that measures in the respective embodiments can not be used in combination to advantage.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art can make various substitutions and modifications, and these substitutions and modifications should all fall within the scope of the present disclosure.

I claim:

1. A parallel structure of semiconductor devices, comprising:
   a vertical active region disposed on a substrate, comprising:
      a plurality of source/drain layers disposed sequentially in a vertical direction on the substrate; and
      two or more channel layers respectively disposed between respective pairs of adjacent ones of the source/drain layers;
   gate stacks respectively formed around at least part of outer peripheries of the respective channel layers, wherein each of the channel layers, the source/drain layers on upper and lower sides of the channel layer, and the gate stack formed around the channel layer form a corresponding one of the semiconductor devices,
   wherein in each of the semiconductor devices, one of the source/drain layers on the upper and lower sides of the corresponding channel layer is in contact with a first electrically conductive channel disposed on an outer periphery of the active region, the other one is in contact with a second electrically conductive channel disposed on the outer periphery of the active region, and the gate stack formed around the channel layer is in contact with a third electrically conductive channel disposed on the outer periphery of the active region,
   wherein the first electrically conductive channel is common to the semiconductor devices, the second electrically conductive channel is common to the semiconductor devices, and the third electronically conductive channel is common to the semiconductor devices.

2. The parallel structure according to claim 1, wherein, the first electrically conductive channel extends vertically on the substrate and occupies a first range in a circumferential direction of the active region;
   the second electrically conductive channel extends vertically on the substrate and occupies a second range different from the first range in the circumferential direction of the active region;
   the third electrically conductive channel extends vertically on the substrate and occupies a third range different from the first range and the second range in the circumferential direction of the active region.

3. The parallel structure according to claim 2, wherein the first range and the second range are opposed to each other.

4. The parallel structure according to claim 3, wherein the active region is substantially rectangular as a whole, comprising a first side and a second side opposite to each other and a third side and a fourth side opposite to each other, wherein the first range and the second range are respectively on the first side and the second side.

5. The parallel structure according to claim 4, wherein the third range is at least on one of the third side and the fourth side.

6. The parallel structure according to claim 2, wherein at least one of the first range, the second range, or the third range comprises a plurality of sub-ranges separated in the circumferential direction of the active region.

7. The parallel structure according to claim 2, further comprising:
   an isolation layer disposed on the outer periphery of the active region, wherein,
   the first electrically conductive channel, the second electrically conductive channel, and the third electronically conductive channel extend on the isolation layer,
   those of the source/drain layers in contact with the first electrically conductive channel pass through the isolation layer at the first range to contact the first electrically conductive channel,
   those of the source/drain layers in contact with the second electrically conductive channel pass through the isolation layer at the second range to contact the second electrically conductive channel,
   the gate stacks pass through the isolation layer at the third range to contact the third electrically conductive channel.

8. The parallel structure according to claim 7, wherein,
   the isolation layer has a substantially flat surface in the vertical direction,
   at the first range, those of the source/drain layers in contact with the first electrically conductive channel protrude outward with respect to the remaining source/drain layers and the gate stacks, so as to expose at the surface of the isolation layer,
   at the second range, those of the source/drain layers in contact with the second electrically conductive channel protrude outward with respect to the remaining source/drain layers and the gate stacks, so as to expose at the surface of the isolation layer,
   at the third range, the gate stacks protrude outward with respect to
   the source/drain layers, so as to expose at the surface of the isolation layer.

9. The parallel structure according to claim 8, wherein, in the vertical direction, sidewalls of the source/drain layers and the gate stacks exposed at the isolation layer are substantially coplanar with the surface of the isolation layer.

10. The parallel structure according to claim 7, wherein the isolation layer comprises a low k material.

11. The parallel structure according to claim 10, wherein the isolation layer comprises carbon-containing silicide or silicon carbide.

12. The parallel structure according to claim 2, wherein the first electrically conductive channel, the second electrically conductive channel, and the third electronically conductive channel are in the form of spacers.

13. The parallel structure according to claim 1, further comprising at least one of:
   a first contact, disposed above a top surface of the active region, and electrically connected to the first electrically conductive channel, wherein the first contact at least partially overlaps at least one layer of the vertical active region and/or the gate stack in the vertical direction;
   a second contact, disposed above the top surface of the active region, and electrically connected to the second electrically conductive channel, wherein the second contact at least partially overlaps at least one layer of the vertical active region and/or the gate stack in the vertical direction; or
   a third contact, disposed above the top surface of the active region, and electrically connected to the third electrically conductive channel, wherein the third contact at least partially overlaps at least one layer of the vertical active region and/or the gate stack in the vertical direction.

14. The parallel structure according to claim 13, further comprising:
a first bridging part extending from under the first contact on the top surface of the active region to contact the first electrically conductive channel in the presence of the first contact,
a second bridging part extending from under the second contact on the top surface of the active region to contact the second electrically conductive channel in the presence of the second contact, or
a third bridging part extending from under the third contact on the top surface of the active region to contact the third electrically conductive channel in the presence of the third contact.

15. The parallel structure according to claim 14, wherein in presence of two or more of the first bridging part, the second bridging part, and the third bridging part, the two or more bridging parts extend coplanarly above the top surface of the active region and are spaced apart from each other.

16. The parallel structure according to claim 13, wherein in presence of two or more of the first contact, the second contact, and the third contact, the two or more contacts are arranged along a longitudinal extension direction of the active region above the top surface of the active region.

17. The parallel structure according to claim 1, wherein at least one of the first electrically conductive channel, the second electrically conductive channel, or the third electronically conductive channel comprises metal and/or metal-semiconductor compound.

18. The parallel structure according to claim 17, wherein the metal comprises at least one of W, Co, or Ru, and the metal-semiconductor compound comprises at least one of Ni Si, NiPtSi, PtSi, CoSi, $CoSi_2$, TiSi, or $TiSi_2$.

19. The parallel structure according to claim 1, wherein at least one of the first electrically conductive channel, the second electrically conductive channel, or the third electronically conductive channel has stress therein.

20. The parallel structure according to claim 19, wherein the stress is compressive stress in the case where the semiconductor devices are n-type device, or tensile stress in the case where the semiconductor devices are p-type device.

21. The parallel structure according to claim 1, wherein the source/drain layers on the upper side and the lower side of each of the channel layers have an etch selectivity with respect to each other, and the source/drain layers have an etch selectivity with respect to the channel layer.

22. The parallel structure according to claim 1, wherein,
the channel layers comprise a same first semiconductor material,
even-numbered ones of the source/drain layers, numbered sequentially in the vertical direction, comprise a same second semiconductor material, and odd-numbered ones of the source/drain layers comprise a same third semiconductor material,
wherein the first semiconductor material, the second semiconductor material, and the third semiconductor material have an etch selectivity with respect to each other.

23. The parallel structure according to claim 22, wherein one of the first semiconductor material, the second semiconductor material, and the third semiconductor material comprises silicon, while the other two comprise SiGe with different atomic percentages of Ge.

24. The parallel structure according to claim 1, wherein at least one of the following is true:
the first electronically conductive channel contacts at least portions of sidewalls of the corresponding source/drain layers,
the second electronically conductive channel contacts at least portions of sidewalls of the corresponding source/drain layers, or
the third electronically conductive channel contacts at least portions of sidewalls of the gate stacks.

25. An electronic device comprising the parallel structure according to claim 1.

26. The electronic device according to claim 25, wherein the electronic device comprises a smart-phone, a computer, a tablet, an artificial intelligence device, a wearable device, or a mobile power.

* * * * *